United States Patent
Lin et al.

(10) Patent No.: US 9,842,826 B2
(45) Date of Patent: Dec. 12, 2017

(54) SEMICONDUCTOR DEVICE AND METHOD OF MANUFACTURE

(71) Applicant: Taiwan Semiconductor Manufacturing Company, Ltd., Hsin-Chu (TW)

(72) Inventors: Jing-Cheng Lin, Hsin-Chu (TW); Chen-Hua Yu, Hsin-Chu (TW); Po-Hao Tsai, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/799,756

(22) Filed: Jul. 15, 2015

(65) Prior Publication Data

US 2017/0018531 A1   Jan. 19, 2017

(51) Int. Cl.
| | |
|---|---|
| H01L 25/065 | (2006.01) |
| H01L 23/552 | (2006.01) |
| H01L 25/00 | (2006.01) |
| H01L 21/56 | (2006.01) |
| H01L 21/3205 | (2006.01) |
| H01L 23/50 | (2006.01) |
| H01L 23/31 | (2006.01) |
| H01L 23/498 | (2006.01) |
| H01L 23/538 | (2006.01) |

(52) U.S. Cl.
CPC ...... *H01L 25/0657* (2013.01); *H01L 21/3205* (2013.01); *H01L 23/49816* (2013.01); *H01L 23/49827* (2013.01); *H01L 23/50* (2013.01); *H01L 23/5389* (2013.01); *H01L 23/552* (2013.01); *H01L 25/50* (2013.01); *H01L 21/561* (2013.01); *H01L 21/568* (2013.01); *H01L 23/3128* (2013.01); *H01L 2224/18* (2013.01); *H01L 2224/48091* (2013.01); *H01L 2224/48227* (2013.01); *H01L 2224/97* (2013.01); *H01L 2225/06548* (2013.01); *H01L 2924/15311* (2013.01); *H01L 2924/181* (2013.01)

(58) Field of Classification Search
CPC . H01L 25/0657; H01L 25/50; H01L 21/3205; H01L 21/56; H01L 23/3107; H01L 23/50; H01L 23/552; H01L 2225/06548
See application file for complete search history.

(56) References Cited

U.S. PATENT DOCUMENTS

| | | | |
|---|---|---|---|
| 8,361,842 | B2 | 1/2013 | Yu et al. |
| 8,680,647 | B2 | 3/2014 | Yu et al. |
| 8,703,542 | B2 | 4/2014 | Lin et al. |

(Continued)

FOREIGN PATENT DOCUMENTS

| | | |
|---|---|---|
| KR | 20130094523 A | 8/2013 |
| KR | 20130111780 A | 10/2013 |

*Primary Examiner* — Whitney T Moore
(74) *Attorney, Agent, or Firm* — Slater Matsil, LLP

(57) ABSTRACT

An integrated fan out package on package architecture is utilized along with a reference via in order to provide a reference voltage that extends through the InFO-POP architecture. If desired, the reference via may be exposed and then connected to a shield coating that can be used to shield the InFO-POP architecture. The reference via may be exposed by exposing either a top surface or a sidewall of the reference via using one or more singulation processes.

20 Claims, 29 Drawing Sheets

(56) References Cited

U.S. PATENT DOCUMENTS

| | | |
|---|---|---|
| 8,759,964 B2 | 6/2014 | Pu et al. |
| 8,766,429 B2 | 7/2014 | Kim |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0115060 A1* | 5/2011 | Chiu .................... H01L 21/568 257/660 |
| 2011/0127654 A1 | 6/2011 | Weng et al. |
| 2011/0241192 A1* | 10/2011 | Ding .................. H01L 21/6835 257/686 |
| 2011/0291288 A1 | 12/2011 | Wu et al. |
| 2011/0298101 A1 | 12/2011 | Pagaila et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0256847 A1 | 10/2013 | Park et al. |
| 2013/0307140 A1 | 11/2013 | Huang et al. |
| 2014/0035156 A1 | 2/2014 | Hsu et al. |
| 2014/0110856 A1* | 4/2014 | Lin ......................... H01L 24/19 257/774 |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0108621 A1 | 4/2015 | Pabst et al. |
| 2015/0145141 A1 | 5/2015 | Uzoh et al. |
| 2015/0179591 A1 | 6/2015 | Tsai et al. |
| 2016/0148857 A1 | 5/2016 | Lin et al. |

\* cited by examiner

SEMICONDUCTOR DEVICE AND METHOD OF MANUFACTURE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
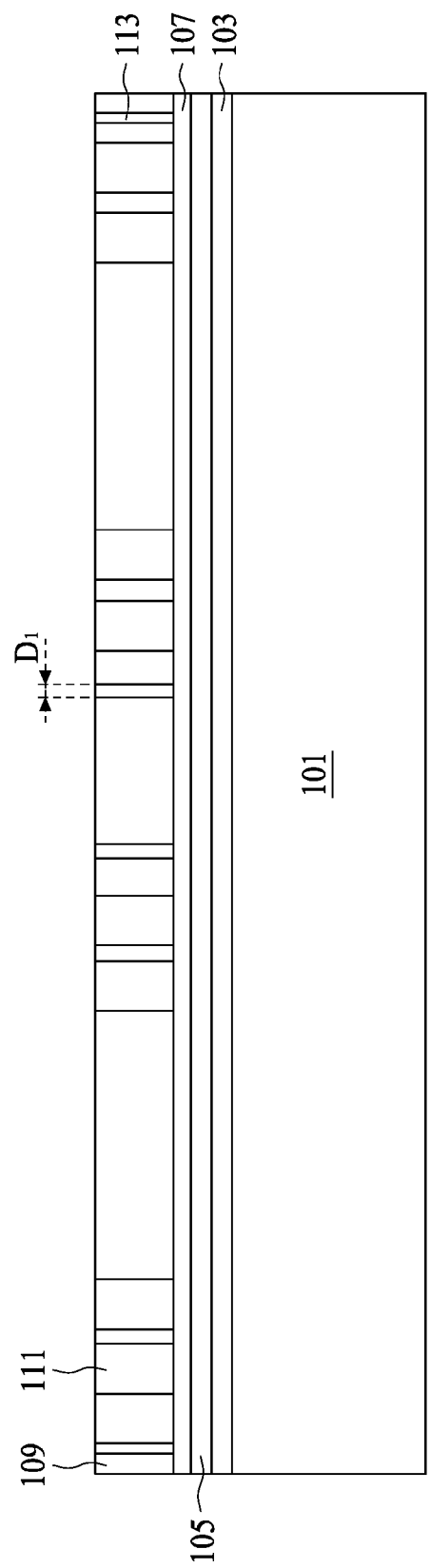
FIG. 1 illustrates a formation of reference vias along with through vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a first carrier substrate 101 with an adhesive layer 103, a polymer layer 105, and a first seed layer 107 over the first carrier substrate 101. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of semiconductor devices such as a first semiconductor device 201 and a second semiconductor device 301 (not illustrated in FIG. 1 but illustrated and discussed below with respect to FIGS. 2-3).

The adhesive layer 103 is placed on the first carrier substrate 101 in order to assist in the adherence of overlying structures (e.g., the polymer layer 105). In an embodiment the adhesive layer 103 may comprise an ultra-violet glue, which loses its adhesive properties when exposed to ultraviolet light. However, other types of adhesives, such as pressure sensitive adhesives, radiation curable adhesives, epoxies, a light to heat conversion (LTHC) material, combinations of these, or the like, may also be used. The adhesive layer 103 may be placed onto the first carrier substrate 101 in a semi-liquid or gel form, which is readily deformable under pressure.

The polymer layer 105 is placed over the adhesive layer 103 and is utilized in order to provide protection to, e.g., the first semiconductor device 201 and the second semiconductor device 301 once the first semiconductor device 201 and the second semiconductor device 301 have been attached. In an embodiment the polymer layer 105 may be polybenzoxazole (PBO), although any suitable material, such as polyimide or a polyimide derivative, may alternatively be utilized. The polymer layer 105 may be placed using, e.g., a spin-coating process to a thickness of between about 0.5 µm and about 10 µm, such as about 5 µm, although any suitable method and thickness may alternatively be used.

The first seed layer 107 is formed over the polymer layer 105. In an embodiment the first seed layer 107 is a thin layer of a conductive material that aids in the formation of a thicker layer during subsequent processing steps. The first seed layer 107 may comprise a layer of titanium about 1,000 Å thick followed by a layer of copper about 5,000 Å thick. The first seed layer 107 may be created using processes such as physical vapor deposition, evaporation, or PECVD processes, or metal foil laminating process, or the like, depending upon the desired materials. The first seed layer 107 may be formed to have a thickness of between about 0.3 µm and about 1 µm, such as about 0.5 µm.

FIG. 1 also illustrates a placement and patterning of a photoresist 109 over the first seed layer 107. In an embodiment the photoresist 109 may be placed on the first seed layer 107 using, e.g., a spin coating technique to a height of between about 50 µm and about 250 µm, such as about 120 µm. Once in place, the photoresist 109 may then be patterned by exposing the photoresist 109 to a patterned energy source (e.g., a patterned light source) so as to induce a chemical reaction, thereby inducing a physical change in those portions of the photoresist 109 exposed to the patterned light source. A developer is then applied to the exposed photoresist 109 to take advantage of the physical changes and selectively remove either the exposed portion of the photoresist 109 or the unexposed portion of the photoresist 109, depending upon the desired pattern.

In an embodiment the pattern formed into the photoresist 109 is a pattern for vias 111 and reference vias 113. The vias 111 are formed in such a placement as to be located on different sides of subsequently attached devices such as the first semiconductor device 201 and the second semiconductor device 301. However, any suitable arrangement for the pattern of vias 111, such as by being located such that the first semiconductor device 201 and the second semiconductor device are placed on opposing sides of the vias 111, may alternatively be utilized.

The reference vias 113 may be positioned in order to provide a reference voltage (such as a ground reference) through the package but not to an overlying semiconductor device (such as the first semiconductor device 201 or the second semiconductor device 301). In another embodiment the reference vias 113 may be positioned in order to provide a reference potential to a shield coating 1201 (not illustrated in FIG. 1 but illustrated and described further below with respect to FIG. 12). However, any suitable positioning may alternatively be used.

In an embodiment the reference vias 113 may be formed in a cylindrical shape with a first diameter $D_1$ of between about 70 µm and about 400 µm, such as about 190 µm. However, any suitable shape (some of which are described further below with respect to FIGS. 21A-22B) may also be used. Additionally, other suitable dimensions may also be utilized. All such shapes and dimensions are fully intended to be included within the scope of the embodiments.

In an embodiment the vias 111 and the reference vias 113 are formed within the photoresist 109. In an embodiment the vias 111 and the reference vias 113 comprise one or more conductive materials, such as copper, tungsten, other conductive metals, or the like, and may be formed, for example, by electroplating, electroless plating, or the like. In an embodiment, an electroplating process is used wherein the first seed layer 107 and the photoresist 109 are submerged or immersed in an electroplating solution. The first seed layer 107 surface is electrically connected to the negative side of an external DC power supply such that the first seed layer 107 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 107, acquires the dissolved atoms, thereby plating the exposed conductive areas of the first seed layer 107 within the opening of the photoresist 109.

Once the vias 111 and the reference vias 113 have been formed using the photoresist 109 and the first seed layer 107, the photoresist 109 may be removed using a suitable removal process (not illustrated in FIG. 1 but seen in FIG. 3 below). In an embodiment, a plasma ashing process may be used to remove the photoresist 109, whereby the temperature of the photoresist 109 may be increased until the photoresist 109 experiences a thermal decomposition and may be removed. However, any other suitable process, such as a wet strip, may alternatively be utilized. The removal of the photoresist 109 may expose the underlying portions of the first seed layer 107.

Once exposed a removal of the exposed portions of the first seed layer 107 may be performed (not illustrated in FIG. 1 but seen in FIG. 3 below). In an embodiment the exposed portions of the first seed layer 107 (e.g., those portions that are not covered by the vias 111 and the reference vias 113) may be removed by, for example, a wet or dry etching process. For example, in a dry etching process reactants may be directed towards the first seed layer 107 using the vias 111 and the reference vias 113 as masks. In another embodiment, etchants may be sprayed or otherwise put into contact with the first seed layer 107 in order to remove the exposed portions of the first seed layer 107. After the exposed portion of the first seed layer 107 has been etched away, a portion of the polymer layer 105 is exposed between the vias 111 and the reference vias 113.

Figure 2:
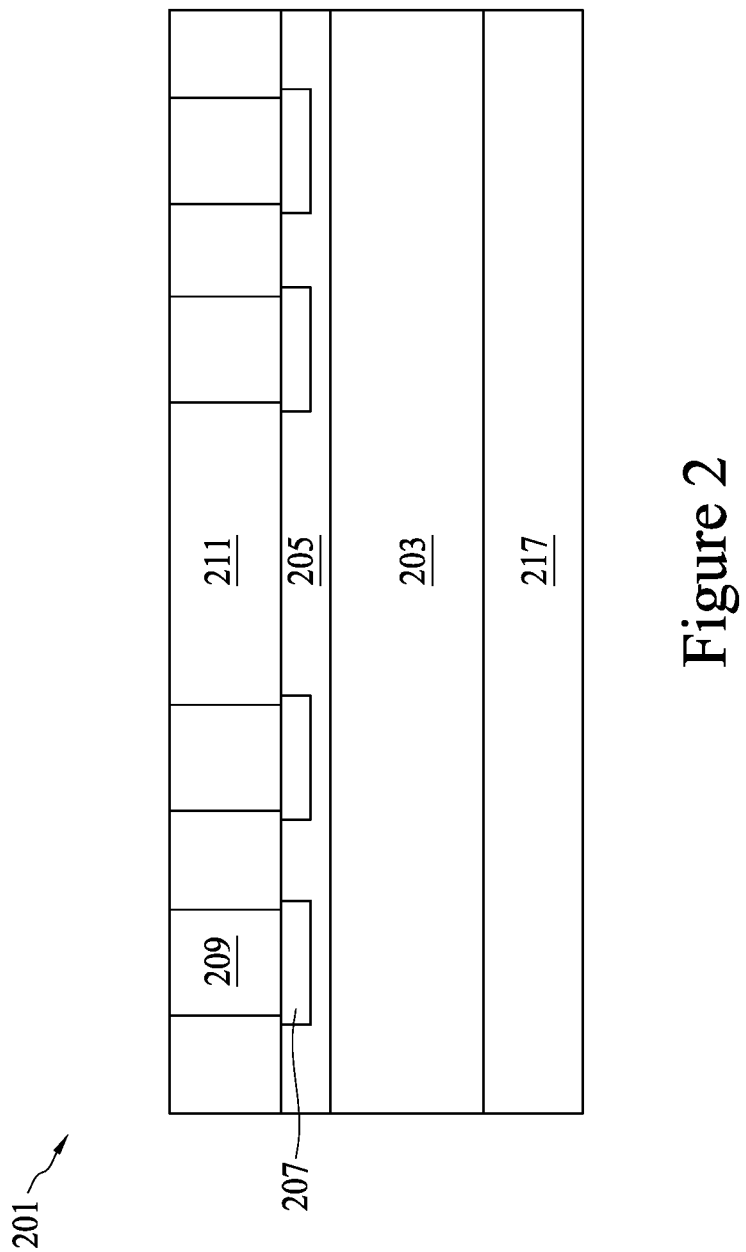
FIG. 2 illustrates a semiconductor die in accordance with some embodiments.

FIG. 2 illustrates a first semiconductor device 201 that will be attached to the polymer layer 105 within the vias 111 (not illustrated in FIG. 2 but illustrated and described below with respect to FIG. 3). In an embodiment the first semiconductor device 201 comprises a first substrate 203, first active devices (not individually illustrated), first metallization layers 205, first contact pads 207, a first passivation layer 211, and first external connectors 209. The first substrate 203 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional features of the design for the first semiconductor device 201. The first active devices may be formed using any suitable methods either within or else on the first substrate 203.

The first metallization layers 205 are formed over the first substrate 203 and the first active devices and are designed to connect the various active devices to form functional circuitry. In an embodiment the first metallization layers 205 are formed of alternating layers of dielectric and conductive material and may be formed through any suitable process (such as deposition, damascene, dual damascene, etc.). In an embodiment there may be four layers of metallization separated from the first substrate 203 by at least one interlayer dielectric layer (ILD), but the precise number of first metallization layers 205 is dependent upon the design of the first semiconductor device 201.

The first contact pads 207 may be formed over and in electrical contact with the first metallization layers 205. The first contact pads 207 may comprise aluminum, but other materials, such as copper, may alternatively be used. The first contact pads 207 may be formed using a deposition process, such as sputtering, to form a layer of material (not shown) and portions of the layer of material may then be removed through a suitable process (such as photolithographic masking and etching) to form the first contact pads 207. However, any other suitable process may be utilized to form the first contact pads 207. The first contact pads may be formed to have a thickness of between about 0.5 µm and about 4 µm, such as about 1.45 µm.

The first passivation layer 211 may be formed on the first substrate 203 over the first metallization layers 205 and the first contact pads 207. The first passivation layer 211 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 211 may be formed through a process such as chemical vapor deposition (CVD), although any suitable process may be utilized, and may have a thickness between about 0.5 µm and about 5 µm, such as about 9.25 KÅ.

The first external connectors 209 may be formed to provide conductive regions for contact between the first contact pads 207 and, e.g., a redistribution layer (RDL) 501 (not illustrated in FIG. 2 but illustrated and described below with respect to FIG. 5). In an embodiment the first external connectors 209 may be conductive pillars and may be formed by initially forming a photoresist (not shown) over the first passivation layer 211 to a thickness between about 5 µm to about 20 µm, such as about 10 µm. The photoresist may be patterned to expose portions of the first passivation layer 211 through which the conductive pillars will extend. Once patterned, the photoresist may then be used as a mask to remove the desired portions of the first passivation layer 211, thereby exposing those portions of the underlying first contact pads 207 to which the first external connectors 209 will make contact.

The first external connectors 209 may be formed within the openings of both the first passivation layer 211 and the photoresist. The first external connectors 209 may be formed from a conductive material such as copper, although other conductive materials such as nickel, gold, solder, metal alloy, combinations of these, or the like may also be used. Additionally, the first external connectors 209 may be formed using a process such as electroplating, by which an electric current is run through the conductive portions of the first contact pads 207 to which the first external connectors 209 are desired to be formed, and the first contact pads 207 are immersed in a solution. The solution and the electric current deposit, e.g., copper, within the openings in order to fill and/or overfill the openings of the photoresist and the first passivation layer 211, thereby forming the first external connectors 209. Excess conductive material and photoresist outside of the openings of the first passivation layer 211 may then be removed using, for example, an ashing process, a chemical mechanical polish (CMP) process, combinations of these, or the like.

However, as one of ordinary skill in the art will recognize, the above described process to form the first external connectors 209 is merely one such description, and is not meant to limit the embodiments to this exact process. Rather, the described process is intended to be merely illustrative, as any suitable process for forming the first external connectors 209 may alternatively be utilized. All suitable processes are fully intended to be included within the scope of the present embodiments.

A first die attach film 217 may be placed on an opposite side of the first substrate 203 in order to assist in the attachment of the first semiconductor device 201 to the polymer layer 105. In an embodiment the first die attach film 217 is an epoxy resin, a phenol resin, acrylic rubber, silica filler, or a combination thereof, and is applied using a lamination technique. However, any other suitable alternative material and method of formation may alternatively be utilized.

Figure 3:
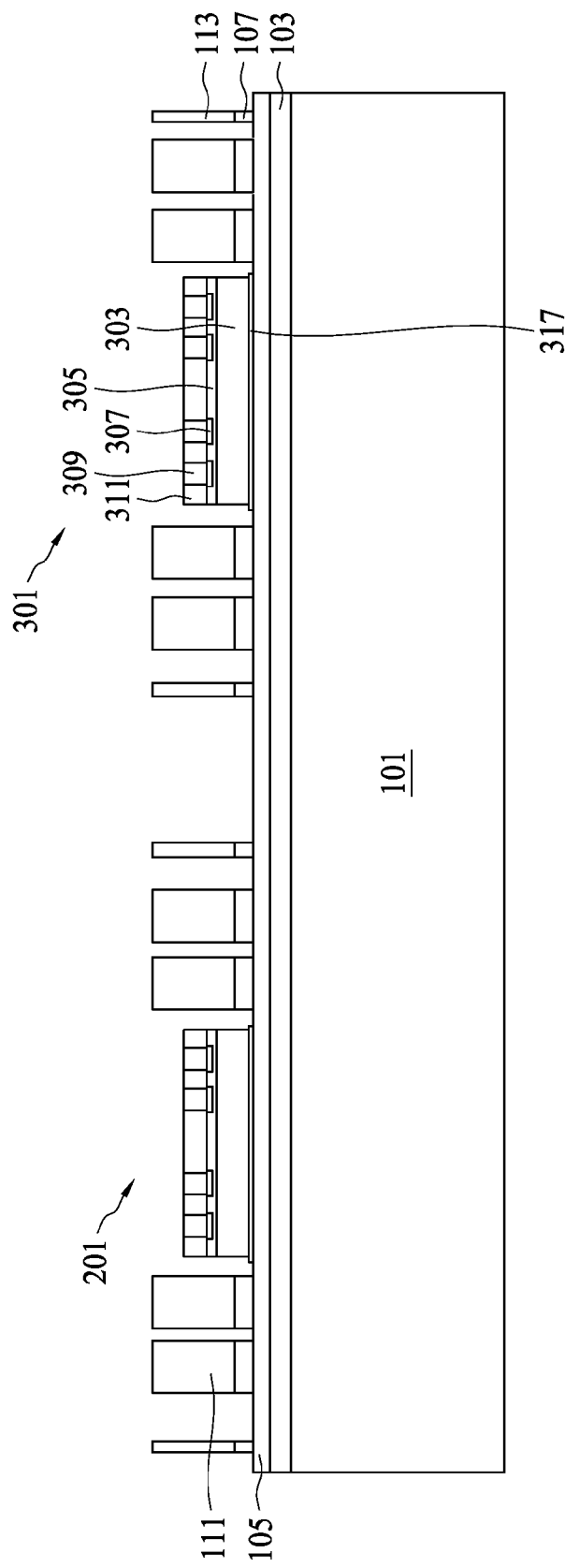
FIG. 3 illustrates a placement of the semiconductor die between the through vias in accordance with some embodiments.

FIG. 3 illustrates a placement of the first semiconductor device 201 onto the polymer layer 105 along with a placement of the second semiconductor device 301. In an embodiment the second semiconductor device 301 may comprise a second substrate 303, second active devices (not individually illustrated), second metallization layers 305, second contact pads 307, a second passivation layer 311, a second external connectors 309, and a second die attach film 317. In an embodiment the second substrate 303, the second active devices, the second metallization layers 305, the second contact pads 307, the second passivation layer 311, the second external connectors 309, and the second die attach film 317 may be similar to the first substrate 203, the first active devices, the first metallization layers 205, the first contact pads 207, the first passivation layer 211, the first external connectors 209, and the first die attach film 217 as described above with respect to FIG. 2, although they may also be different.

In an embodiment the first semiconductor device 201 and the second semiconductor device 301 may be placed onto the polymer layer 105 between different ones of the vias 111 or the reference vias 113. In an embodiment the first semiconductor device 201 and the second semiconductor device 301 may be placed using, e.g., a pick and place process. However, any other method of placing the first semiconductor device 201 and the second semiconductor device 301 onto the polymer layer 105 may also be utilized.

Figure 4:
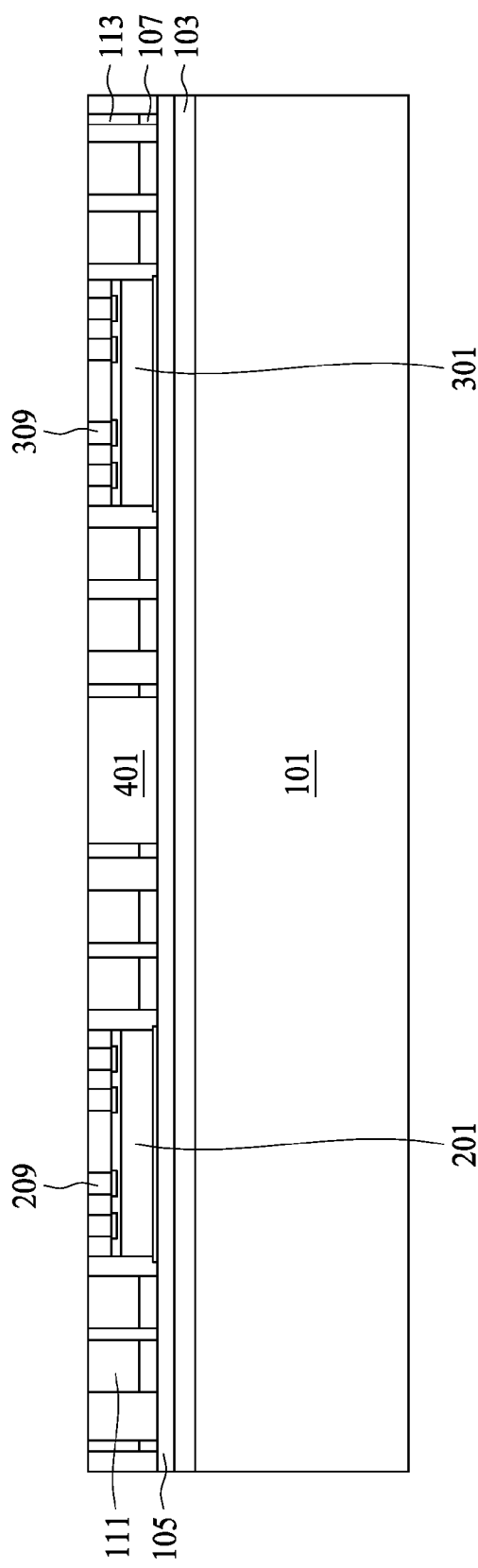
FIG. 4 illustrates an encapsulation of the reference via, the through vias, and the semiconductor die in accordance with some embodiments.

FIG. 4 illustrates an encapsulation of the vias 111, the reference vias 113, the first semiconductor device 201 and the second semiconductor device 301. The encapsulation may be performed in a molding device (not individually illustrated in FIG. 4), which may comprise a top molding portion and a bottom molding portion separable from the top molding portion. When the top molding portion is lowered to be adjacent to the bottom molding portion, a molding cavity may be formed for the first carrier substrate 101, the vias 111, the reference vias 113, the first semiconductor device 201, and the second semiconductor device 301.

During the encapsulation process the top molding portion may be placed adjacent to the bottom molding portion, thereby enclosing the first carrier substrate 101, the vias 111, the reference vias 113, the first semiconductor device 201, and the second semiconductor device 301 within the molding cavity. Once enclosed, the top molding portion and the bottom molding portion may form an airtight seal in order to control the influx and outflux of gasses from the molding cavity. Once sealed, an encapsulant 401 may be placed within the molding cavity. The encapsulant 401 may be a molding compound resin such as polyimide, PPS, PEEK, PES, a heat resistant crystal resin, combinations of these, or the like. The encapsulant 401 may be placed within the molding cavity prior to the alignment of the top molding portion and the bottom molding portion, or else may be injected into the molding cavity through an injection port.

Once the encapsulant 401 has been placed into the molding cavity such that the encapsulant 401 encapsulates the first carrier substrate 101, the vias 111, the reference vias 113, the first semiconductor device 201, and the second semiconductor device 301, the encapsulant 401 may be cured in order to harden the encapsulant 401 for optimum protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C., such as about 125° C. for about 60 sec to about 3600 sec, such as about 600 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing processes, such as irradiation or even allowing the encapsulant 401 to harden at ambient temperature, may alternatively be used. Any suitable curing process may be used, and all such processes are fully intended to be included within the scope of the embodiments discussed herein.

FIG. 4 also illustrates a thinning of the encapsulant 401 in order to expose the vias 111, the reference vias 113, the first semiconductor device 201, and the second semiconductor device 301 for further processing. The thinning may be performed, e.g., using a mechanical grinding or chemical mechanical polishing (CMP) process whereby chemical etchants and abrasives are utilized to react and grind away the encapsulant 401, the first semiconductor device 201 and the second semiconductor device 301 until the vias 111, the reference vias 113, the first external connectors 209 (on the first semiconductor device 201), and the second external connectors 309 (on the second semiconductor device 301) have been exposed. As such, the first semiconductor device 201, the second semiconductor device 301, the vias 111, and the reference vias 113 may have a planar surface that is also planar with the encapsulant 401.

However, while the CMP process described above is presented as one illustrative embodiment, it is not intended to be limiting to the embodiments. Any other suitable removal process may be used to thin the encapsulant 401, the first semiconductor device 201, and the second semiconductor device 301 and expose the vias 111. For example, a series of chemical etches may be utilized. This process and any other suitable process may be utilized to thin the encapsulant 401, the first semiconductor device 201, and the second semiconductor device 301, and all such processes are fully intended to be included within the scope of the embodiments.

Figure 5:
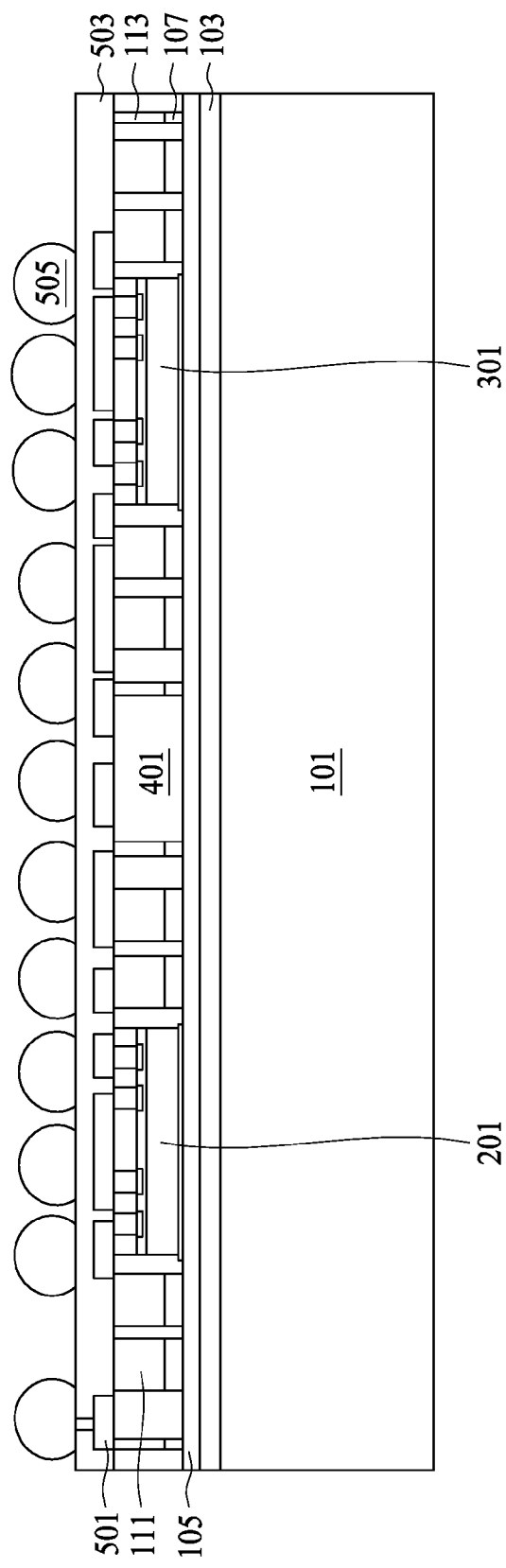
FIG. 5 illustrates a formation of a redistribution layer in accordance with some embodiments.

FIG. 5 illustrates a formation of the RDL 501 in order to interconnect the first semiconductor device 201, the second semiconductor device 301, the vias 111, the reference vias 113 and third external connectors 505. By using the RDL 501 to interconnect the first semiconductor device 201 and the second semiconductor device 301, the first semiconductor device 201 and the second semiconductor device 301 may have a pin count of greater than 1000.

In an embodiment the RDL 501 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the RDL 501 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may be used to form the RDL 501.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

FIG. 5 also illustrates a formation of a third passivation layer 503 over the RDL 501 in order to provide protection and isolation for the RDL 501 and the other underlying structures. In an embodiment the third passivation layer 503 may be polybenzoxazole (PBO), although any suitable material, such as polyimide or a polyimide derivative, may be utilized. The third passivation layer 503 may be placed using, e.g., a spin-coating process to a thickness of between about 5 µm and about 25 µm, such as about 7 µm, although any suitable method and thickness may alternatively be used.

In an embodiment the thickness of the structure from the third passivation layer 503 to the polymer layer 105 may be less than or equal to about 200 µm. By making this thickness as thin as possible, the overall structure may be utilized in various small size applications, such as cell phones and the like, while still maintaining the desired functionality. However, as one of ordinary skill in the art will recognize, the precise thickness of the structure may be dependent at least in part upon the overall design for the unit and, as such, any suitable thickness may alternatively be utilized.

Additionally, the RDL 501 is formed to interconnect the reference vias 113 with one of the third external connectors 505 (with only a single one of the reference vias 113 actually illustrated as being connected). In an embodiment the one of the third external connectors 505 that is connected to the reference vias 113 may be connected (through, e.g., a printed circuit board that is not illustrated) to a reference voltage, such as a reference voltage, although any suitable reference bias may be utilized.

Also, while only a single RDL 501 is illustrated in FIG. 5, this is intended for clarity and is not intended to limit the embodiments. Rather, any suitable number of conductive and passivation layers, such as three RDL 501 layers, may be formed by repeating the above described process to form the RDL 501. Any suitable number of layers may be utilized.

FIG. 5 further illustrates a formation of the third external connectors 505 to make electrical contact with the RDL 501. In an embodiment after the third passivation layer 503 has been formed, an opening may be made through the third passivation layer 503 by removing portions of the third passivation layer 503 to expose at least a portion of the underlying RDL 501. The opening allows for contact between the RDL 501 and the third external connectors 505. The opening may be formed using a suitable photolithographic mask and etching process, although any suitable process to expose portions of the RDL 501 may be used.

In an embodiment the third external connectors 505 may be placed on the RDL 501 through the third passivation layer 503 and may be a ball grid array (BGA) which comprises a eutectic material such as solder, although any suitable materials may alternatively be used. Optionally, an underbump metallization may be utilized between the third external connectors 505 and the RDL 501. In an embodiment in which the third external connectors 505 are solder bumps, the third external connectors 505 may be formed using a ball drop method, such as a direct ball drop process. Alternatively, the solder bumps may be formed by initially forming a layer of tin through any suitable method such as evaporation, electroplating, printing, solder transfer, and then performing a reflow in order to shape the material into the desired bump shape. Once the third external connectors 505 have been formed, a test may be performed to ensure that the structure is suitable for further processing.

Figure 6A:
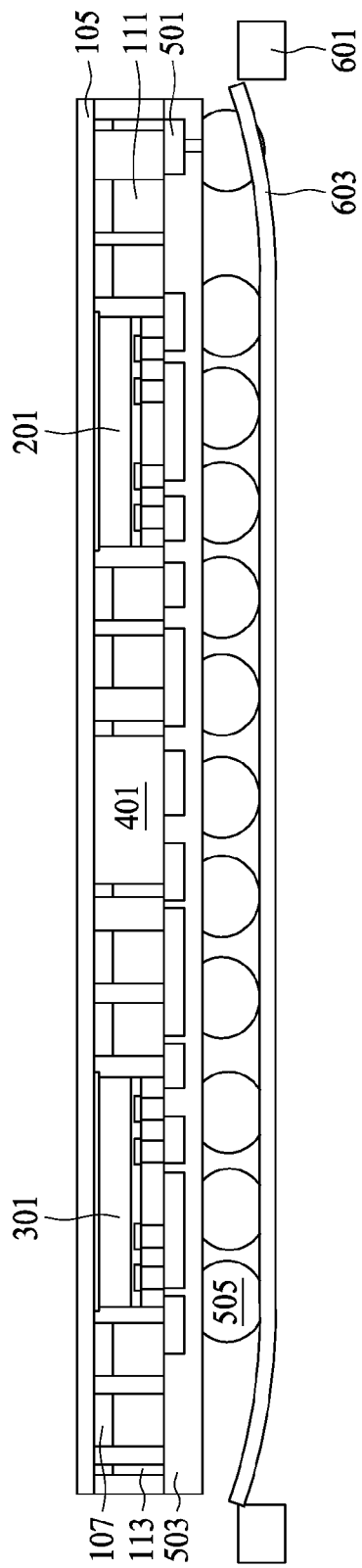
FIGS. 6A-6B illustrate a removal of a carrier in accordance with some embodiments.

FIG. 6A illustrates a debonding of the first carrier substrate 101 from the first semiconductor device 201 and the second semiconductor device 301. In an embodiment the third external connectors 505 and, hence, the structure including the first semiconductor device 201 and the second semiconductor device 301, may be attached to a ring structure 601. The ring structure 601 may be a metal ring intended to provide support and stability for the structure during and after the debonding process. In an embodiment the third external connectors 505, the first semiconductor device 201, and the second semiconductor device 301 are attached to the ring structure using, e.g., a ultraviolet tape 603, although any other suitable adhesive or attachment may alternatively be used.

Once the third external connectors 505 and, hence, the structure including the first semiconductor device 201 and the second semiconductor device 301 are attached to the ring structure 601, the first carrier substrate 101 may be debonded from the structure including the first semiconductor device 201 and the second semiconductor device 301 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the first carrier substrate 101 and the adhesive layer 103 may be physically separated and removed from the structure comprising the third external connectors 505, the first semiconductor device 201, and the second semiconductor device 301.

Figure 6B:
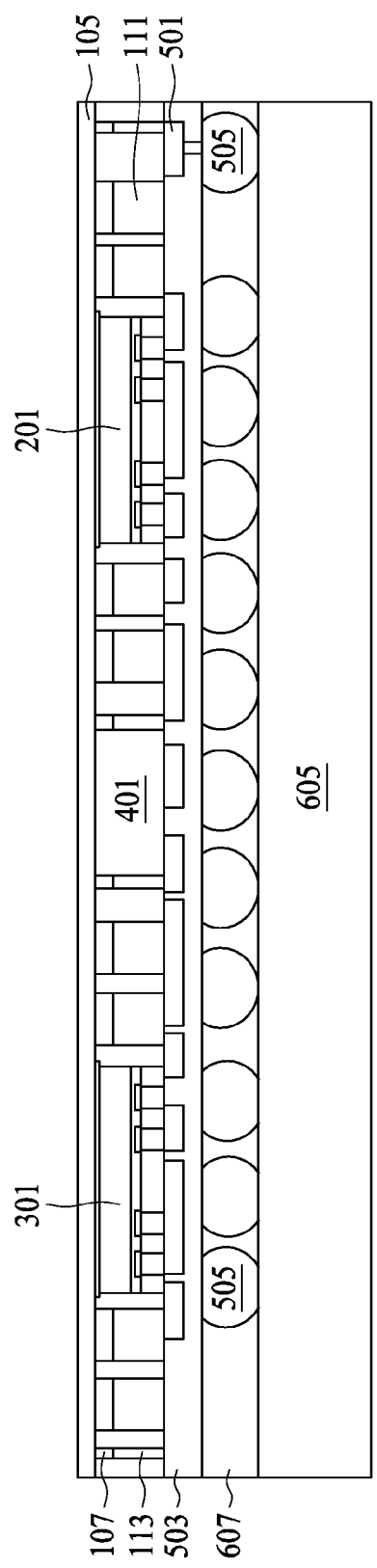

FIG. 6B illustrates another embodiment for debonding the first carrier substrate 101 from the first semiconductor device 201 and the second semiconductor device 301. In this embodiment the third external connectors 505 may be attached to a second carrier substrate 605 using, e.g., a first glue 607. In an embodiment the second carrier substrate 605 is similar to the first carrier substrate 101, although it may also be different. Once attached, the adhesive layer 103 may be irradiated and the adhesive layer 103 and the first carrier substrate 101 may be physically removed.

Figure 7:
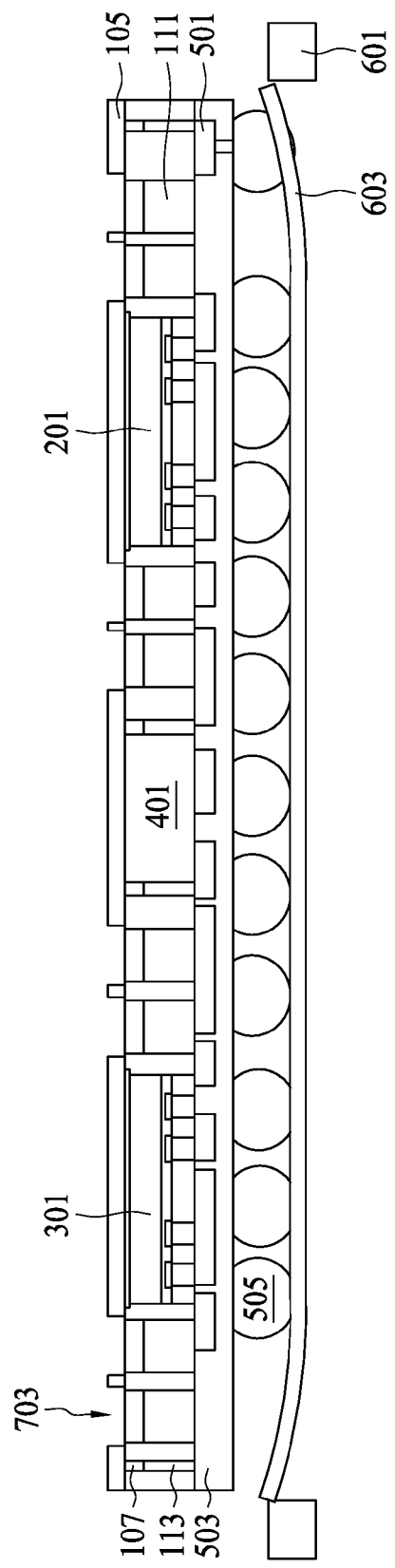
FIG. 7 illustrates a patterning of a polymer layer in accordance with some embodiments.

Returning to an embodiment in which the ring structure 601 is utilized, FIG. 7 illustrates a patterning of the polymer layer 105 in order to form first openings 703 and expose the vias 111 (along with the associated first seed layer 107). In an embodiment the polymer layer 105 may be patterned using, e.g., a laser drilling method, by which a laser is directed towards those portions of the polymer layer 105 which are desired to be removed in order to expose the underlying vias 111. During the laser drilling process the drill energy may be in a range from 0.1 mJ to about 60 mJ, and a drill angle of about 0 degree (perpendicular to the polymer layer 105) to about 85 degrees to normal of the polymer layer 105. In an embodiment the patterning may be formed to form openings over the vias 111 to have a width of between about 70 μm and about 300 μm, such as about 200 μm.

In another embodiment, the polymer layer 105 may be patterned by initially applying a photoresist (not individually illustrated in FIG. 7) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105, such as a plasma etch (PLDC), may be utilized.

Figure 8:
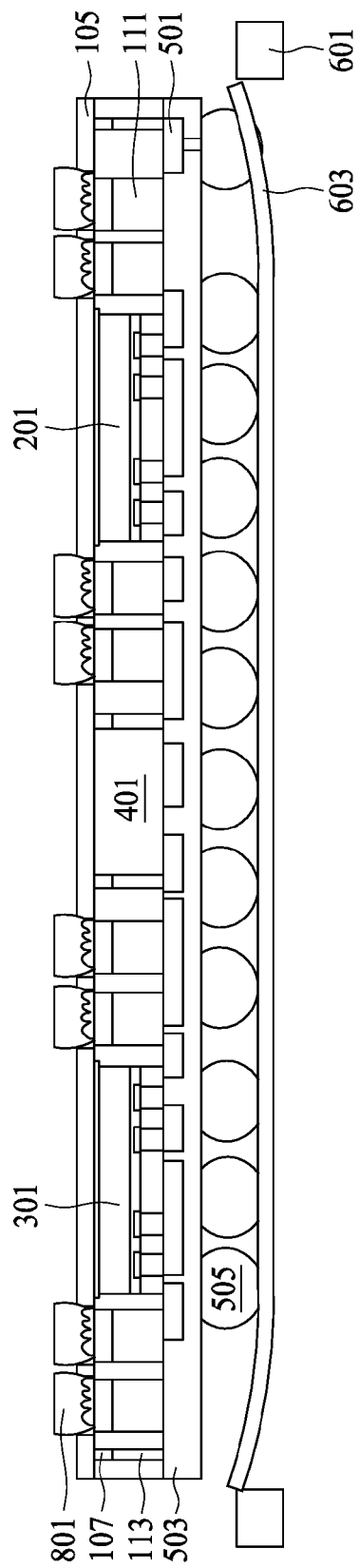
FIG. 8 illustrates a placement of external connections in accordance with some embodiments.

FIG. 8 illustrates a placement of backside ball pads 801 within the first openings 703 in order to protect the now exposed vias 111. In an embodiment the backside ball pads 801 may comprise a conductive material such as solder on paste or an organic solderability preservative (OSP), although any suitable material may alternatively be utilized. In an embodiment the backside ball pads 801 may be applied using a stencil, although any suitable method of application may alternatively be utilized, and then reflowed in order to form a bump shape.

FIG. 8 additionally illustrates an optional leveling or coining process that may be performed on the backside ball pads 801. In an embodiment the backside ball pads 801 may be physically shaped using, e.g., a stencil that is placed around each of the backside ball pads 801 and a press that applies pressure to physically deform the portions of the backside ball pads 801 and to flatten the top surface of the backside ball pads 801.

Figure 9:
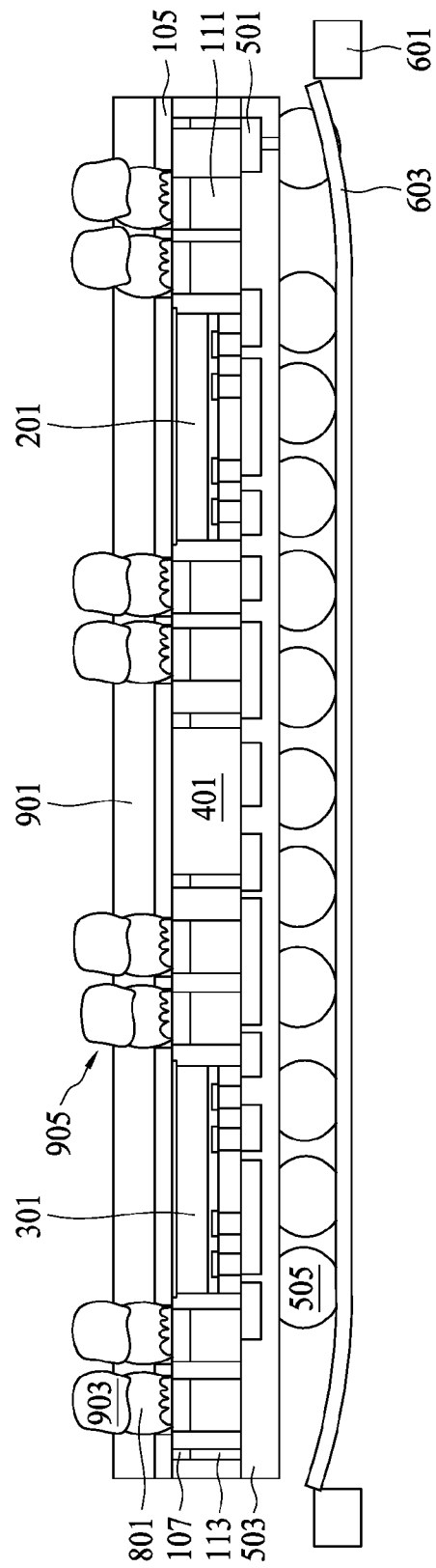
FIG. 9 illustrates a placement of a protective layer in accordance with some embodiments.

FIG. 9 illustrates a placement and patterning of an optional backside protection layer 901 over the backside ball pads 801, effectively sealing the joint between the backside ball pads 801 and the vias 111 from intrusion by moisture.

In an embodiment the backside protection layer 901 may be a protective material such as a PBO, Solder Resistance (SR), Lamination Compound (LC) tape, Ajinomoto build-up film (ABF), non-conductive paste (NCP), non-conductive film (NCF), patterned underfill (PUF), warpage improvement adhesive (WIA), liquid molding compound V9, combinations of these, or the like. However, any suitable material may also be used. The backside protection layer 901 may be applied using a process such as screen printing, lamination, spin coating, or the like, to a thickness of between about 1 µm to about 100 µm.

FIG. 9 also illustrates that, once the backside protection layer 901 has been placed, the backside protection layer 901 may be patterned in order to expose the backside ball pads 801. In an embodiment the patterning may be formed to form second openings 905 over the backside ball pads 801, and the second openings 905 may be formed to have a diameter of between about 30 µm and about 300 µm, such as about 150 µm. In an embodiment, the backside protection layer 901 may be patterned by initially applying a photoresist (not individually illustrated in FIG. 9) to the backside protection layer 901 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the backside protection layer 901 are removed with, e.g., a dry etch process. However, any other suitable method for patterning the backside protection layer 901 may be utilized.

FIG. 9 also illustrates a placement of fourth external connections 903 within the openings of the patterned backside protection layer 901. In an embodiment the fourth external connections 903 may be formed to provide an external connection between the backside ball pads 801 and, e.g., a first package 1000 and a second package 1019 (not illustrated in FIG. 9 but illustrated and discussed below with respect to FIG. 10). The fourth external connections 903 may be contact bumps such as microbumps or controlled collapse chip connection (C4) bumps and may comprise a material such as tin, or other suitable materials, such as solder on past, silver, or copper. In an embodiment in which the fourth external connections 903 are tin solder bumps, the fourth external connections 903 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Figure 10:
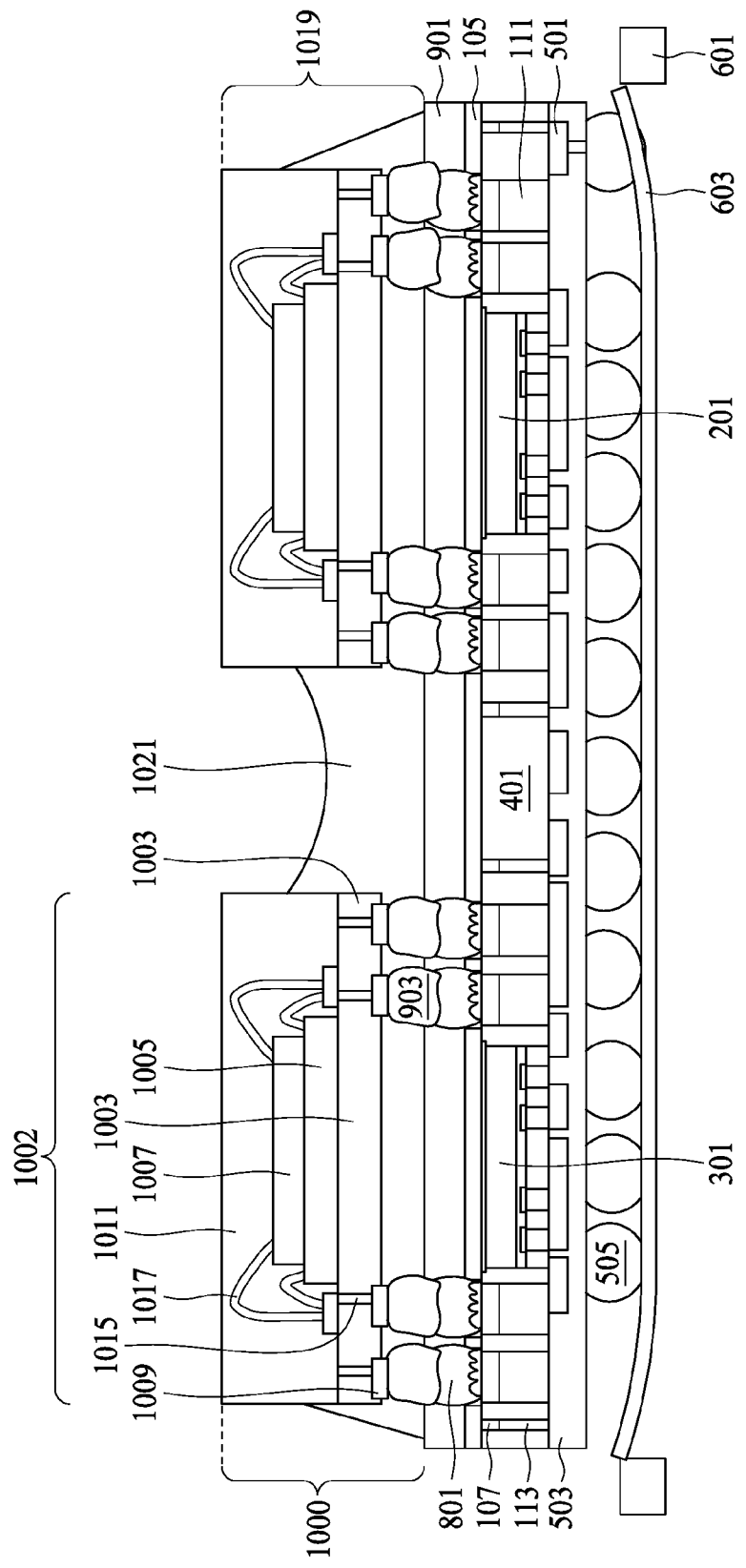
FIG. 10 illustrates a bonding of a first package and a second package in accordance with some embodiments.

FIG. 10 illustrates a bonding of the backside ball pads 801 to a first package 1000. In an embodiment the first package 1000 may comprise a third substrate 1003, a third semiconductor device 1005, a fourth semiconductor device 1007 (bonded to the third semiconductor device 1005), third contact pads 1009 (for electrical connection to the fourth external connections 903), and a second encapsulant 1011. In an embodiment the third substrate 1003 may be, e.g., a packaging substrate comprising internal interconnects (e.g., through substrate vias 1015) to connect the third semiconductor device 1005 and the fourth semiconductor device 1007 to the backside ball pads 801.

Alternatively, the third substrate 1003 may be an interposer used as an intermediate substrate to connect the third semiconductor device 1005 and the fourth semiconductor device 1007 to the backside ball pads 801. In this embodiment the third substrate 1003 may be, e.g., a silicon substrate, doped or undoped, or an active layer of a silicon-on-insulator (SOI) substrate. However, the third substrate 1003 may alternatively be a glass substrate, a ceramic substrate, a polymer substrate, or any other substrate that may provide a suitable protection and/or interconnection functionality. These and any other suitable materials may alternatively be used for the third substrate 1003.

The third semiconductor device 1005 may be a semiconductor device designed for an intended purpose such as being a logic die, a central processing unit (CPU) die, a memory die (e.g., a DRAM die), combinations of these, or the like. In an embodiment the third semiconductor device 1005 comprises integrated circuit devices, such as transistors, capacitors, inductors, resistors, first metallization layers (not shown), and the like, therein, as desired for a particular functionality. In an embodiment the third semiconductor device 1005 is designed and manufactured to work in conjunction with or concurrently with the first semiconductor device 201.

The fourth semiconductor device 1007 may be similar to the third semiconductor device 1005. For example, the fourth semiconductor device 1007 may be a semiconductor device designed for an intended purpose (e.g., a DRAM die) and comprising integrated circuit devices for a desired functionality. In an embodiment the fourth semiconductor device 1007 is designed to work in conjunction with or concurrently with the first semiconductor device 201 and/or the third semiconductor device 1005.

The fourth semiconductor device 1007 may be bonded to the third semiconductor device 1005. In an embodiment the fourth semiconductor device 1007 is only physically bonded with the third semiconductor device 1005, such as by using an adhesive. In this embodiment the fourth semiconductor device 1007 and the third semiconductor device 1005 may be electrically connected to the third substrate 1003 using, e.g., wire bonds 1017, although any suitable electrical bonding may be utilized.

Alternatively, the fourth semiconductor device 1007 may be bonded to the third semiconductor device 1005 both physically and electrically. In this embodiment the fourth semiconductor device 1007 may comprise fourth external connections (not separately illustrated in FIG. 10) that connect with fifth external connection (also not separately illustrated in FIG. 10) on the third semiconductor device 1005 in order to interconnect the fourth semiconductor device 1007 with the third semiconductor device 1005.

The third contact pads 1009 may be formed on the third substrate 1003 to form electrical connections between the third semiconductor device 1005 and, e.g., the fourth external connections 903. In an embodiment the third contact pads 1009 may be formed over and in electrical contact with electrical routing (such as through substrate vias 1015) within the third substrate 1003. The third contact pads 1009 may comprise aluminum, but other materials, such as copper, may alternatively be used. The third contact pads 1009 may be formed using a deposition process, such as sputtering, to form a layer of material (not shown) and portions of the layer of material may then be removed through a suitable process (such as photolithographic masking and etching) to form the third contact pads 1009. However, any other suitable process may be utilized to form the third contact pads 1009. The third contact pads 1009 may be formed to have a thickness of between about 0.5 μm and about 4 μm, such as about 1.45 μm.

The second encapsulant 1011 may be used to encapsulate and protect the third semiconductor device 1005, the fourth semiconductor device 1007, and the third substrate 1003. In an embodiment the second encapsulant 1011 may be a molding compound and may be placed using a molding device (not illustrated in FIG. 10). For example, the third substrate 1003, the third semiconductor device 1005, and the fourth semiconductor device 1007 may be placed within a cavity of the molding device, and the cavity may be hermetically sealed. The second encapsulant 1011 may be placed within the cavity either before the cavity is hermetically sealed or else may be injected into the cavity through an injection port. In an embodiment the second encapsulant 1011 may be a molding compound resin such as polyimide, PPS, PEEK, PES, a heat resistant crystal resin, combinations of these, or the like.

Once the second encapsulant 1011 has been placed into the cavity such that the second encapsulant 1011 encapsulates the region around the third substrate 1003, the third semiconductor device 1005, and the fourth semiconductor device 1007, the second encapsulant 1011 may be cured in order to harden the second encapsulant 1011 for optimum protection. While the exact curing process is dependent at least in part on the particular material chosen for the second encapsulant 1011, in an embodiment in which molding compound is chosen as the second encapsulant 1011, the curing could occur through a process such as heating the second encapsulant 1011 to between about 100° C. and about 130° C., such as about 125° C. for about 60 sec to about 3000 sec, such as about 600 sec. Additionally, initiators and/or catalysts may be included within the second encapsulant 1011 to better control the curing process.

However, as one having ordinary skill in the art will recognize, the curing process described above is merely an exemplary process and is not meant to limit the current embodiments. Other curing processes, such as irradiation or even allowing the second encapsulant 1011 to harden at ambient temperature, may be used. Any suitable curing process may be used, and all such processes are fully intended to be included within the scope of the embodiments discussed herein.

Once the fourth external connections 903 have been formed, the fourth external connections 903 are aligned with and placed into physical contact with the backside ball pads 801, and a bonding is performed. For example, in an embodiment in which the fourth external connections 903 are solder bumps, the bonding process may comprise a reflow process whereby the temperature of the fourth external connections 903 is raised to a point where the fourth external connections 903 will liquefy and flow, thereby bonding the first package 1000 to the backside ball pads 801 once the fourth external connections 903 resolidifies.

By placing the first package 1000 (which may be, e.g., a DRAM package) over the first semiconductor device 301, the first package 1000 is placed over a first receiving region 1002 designed to receive the first package 1000. In an embodiment the first receiving region 1002 has a size and shape determined by the desired size of the first package 1000 which is placed onto the first receiving region 1002. However, the reference vias 113 are located outside of the first receiving region 1002 in a direction parallel with a major surface of the encapsulant 401 such that the first package 1000 is not directly over the reference vias 113.

FIG. 10 additionally illustrates the bonding of a second package 1019 to the backside ball pads 801. In an embodiment the second package 1019 may be similar to the first package 1000, and may be bonded to the backside ball pads 801 utilizing similar processes. However, the second package 1019 may also be different from the first package 1000.

FIG. 10 also illustrates a placement of an underfill material 1021 between the first package 1000, the second package 1019, and the backside protection layer 901. In an embodiment the underfill material 1021 is a protective material used to cushion and support the first package 1000, the second package 1019 and the backside protection layer 901 from operational and environmental degradation, such as stresses caused by the generation of heat during operation. The underfill material 1021 may be injected or otherwise formed in the space between the first package 1000, the second package 1019, and the backside protection layer 901 and may, for example, comprise a liquid epoxy that is dispensed between the first package 1000, the second package 1019, and the backside protection layer 901, and then cured to harden.

Figure 11A:
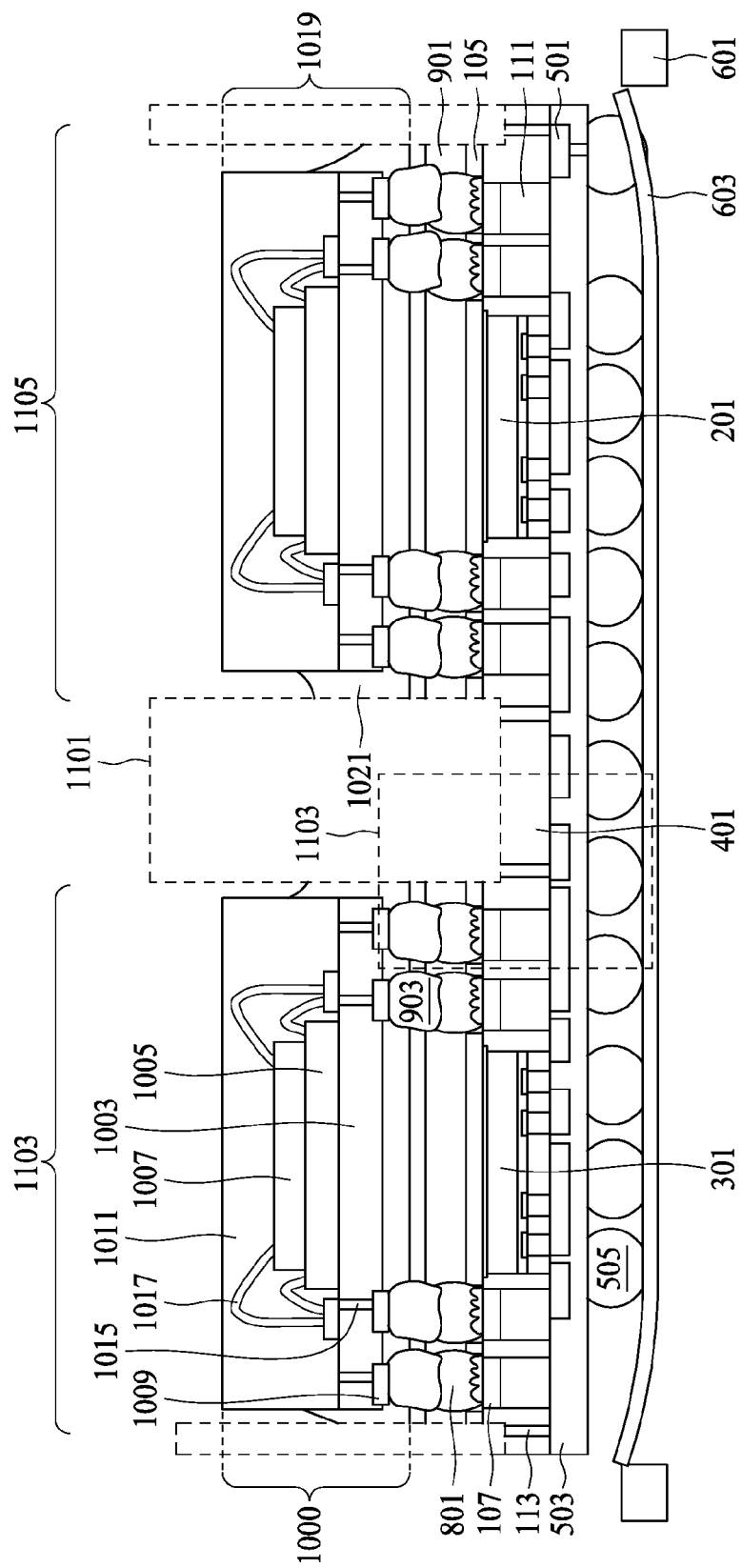
FIGS. 11A-11B illustrate an exposure of the reference vias in accordance with some embodiments.
Figure 11B:
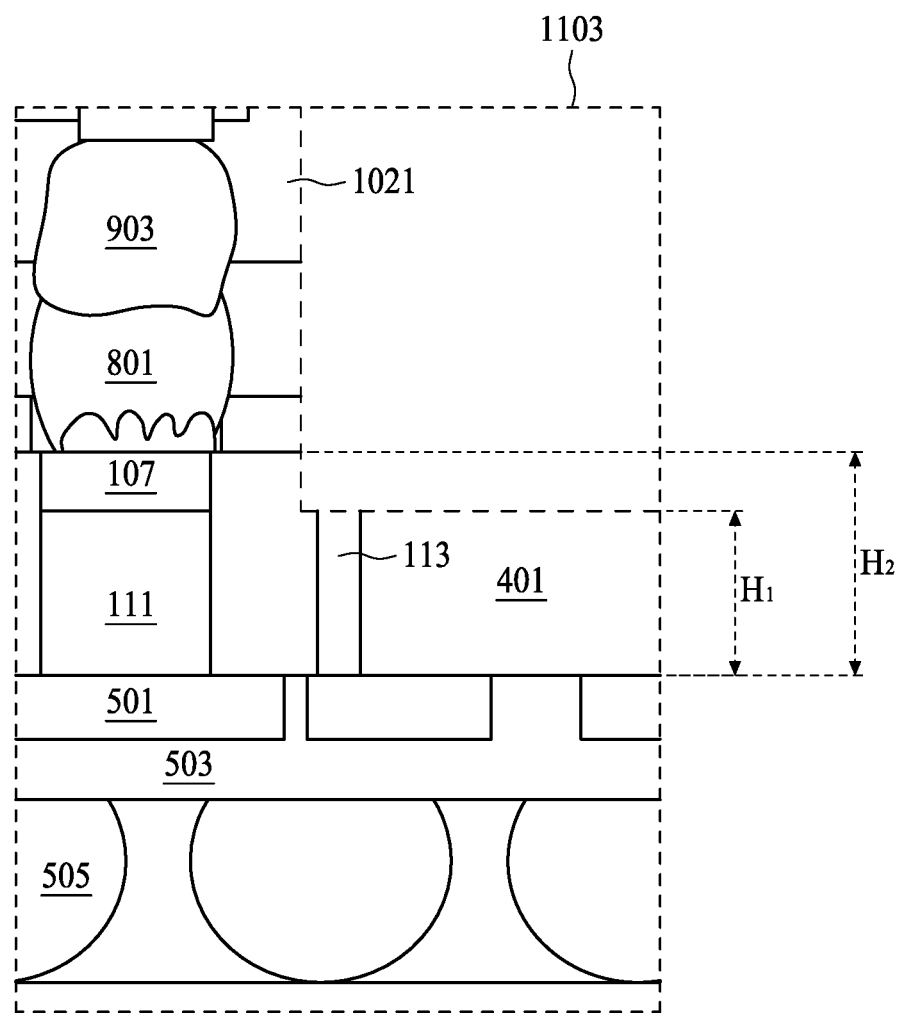

FIGS. 11A-11B illustrate a first singulation process (represented in FIG. 11A by the dashed box 1101) that is utilized to begin singulating and forming a first integrated fan out package-on-package (InFO-POP) structure 1103 and a second integrated fan out package-on-package (InFO-POP) structure 1105 (with FIG. 11B illustrating an enlarged view of the dashed box in FIG. 11A labeled 1103). In an embodiment the first singulation process 1101 may be performed by using a saw blade (not separately illustrated) to slice through the underfill material 1021, the backside protection layer 901 and the polymer layer 105 between the vias 111 and within a scribe region that surrounds the first InFO-POP structure 1103 and the second InFO-POP structure 1105 and also to expose an upper surface of the reference vias 113. However, as one of ordinary skill in the art will recognize, utilizing a saw blade for the first singulation process 1101 is merely one illustrative embodiment and is not intended to be limiting. Any method for performing the first singulation process 1101, such as utilizing one or more etches, may be utilized. These methods and any other suitable methods may be utilized to singulate the first InFO-POP structure 1103.

Additionally, while FIG. 11A is illustrated as using a single cut to expose multiple ones of the reference vias 113, this is intended to be illustrative and is not intended to limit the embodiments. Rather, any suitable number of cuts, such as one cut to expose each of the reference vias 113, or a combination of cuts that expose multiple ones of the reference vias 113, or any other combination, may be used. All suitable combinations of cuts, etches, or other singulation processes are fully intended to be included within the scope of the embodiments.

Looking closer at FIG. 11B, the first seed layer 107 and the vias 111 remain insulated by the encapsulant 401. However, by utilizing the first singulation process 1101 to expose the top surface of the reference vias 113, the first singulation process 1101 can, in some embodiments, remove a portion of the reference vias 113, causing a difference in height between the reference vias 113 (and those portions of the encapsulant 401 that were affected by the first singulation process 1101) and the portions of the encapsulant 401 that were not affected by the first singulation process 1101 as well as forming a different height from the vias 111. For example, after the first singulation process 1101 has been performed, the reference vias 113 may have a first height $H_1$ of between about 80 and about 250 μm, such as about 120 μm, while the encapsulant 401 may have a second height $H_2$ that is greater than the first height $H_1$, such as by being between about 100 μm and about 300 μm, such as about 150 μm. Additionally, because the vias 111 may have the same second height $H_2$, (see FIG. 4), the first height H1 of the reference vias 111 may be smaller than the second height H2 of the vias 111 as well.

Figure 12A:
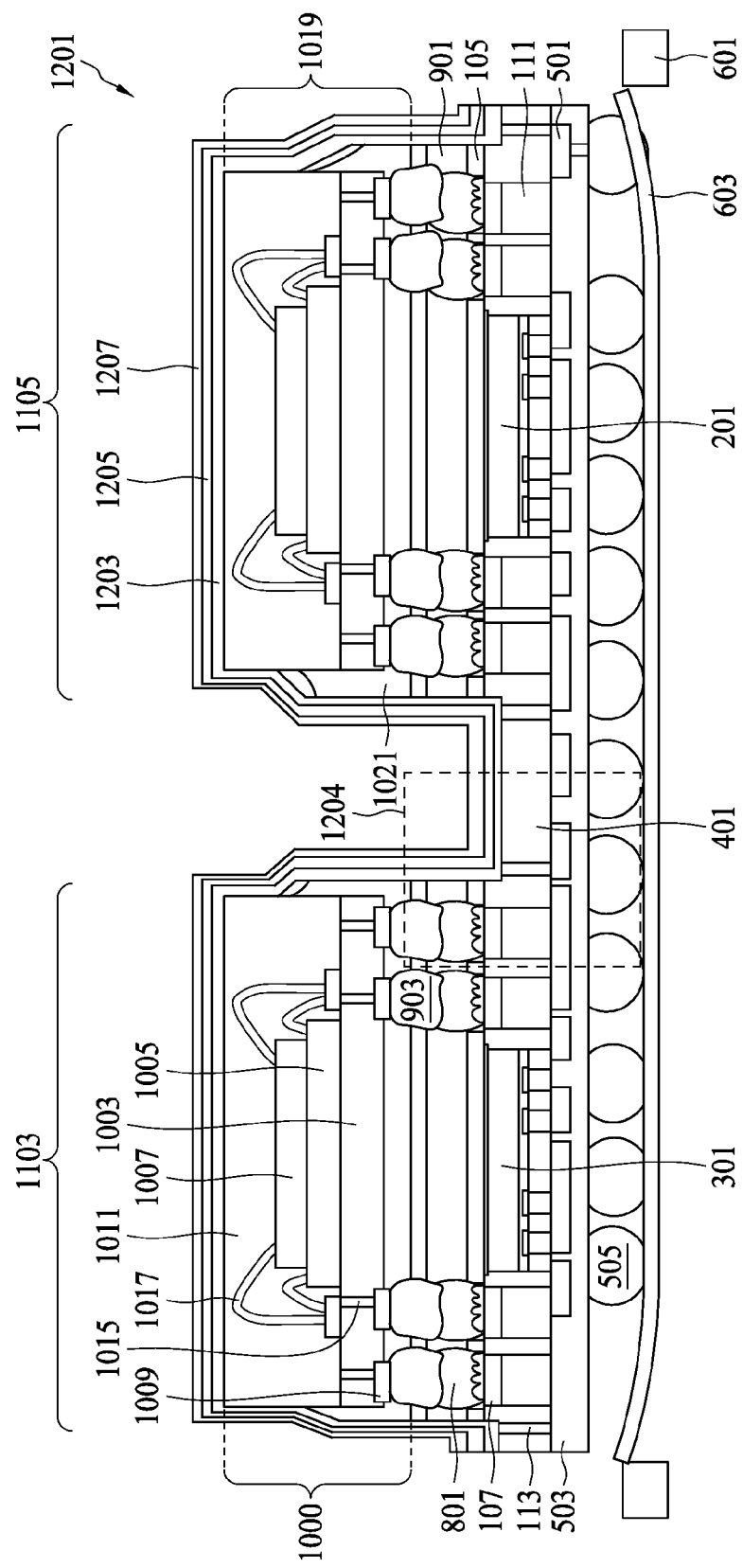
FIGS. 12A-12B illustrate a formation of a shield coating in accordance with some embodiments.
Figure 12B:
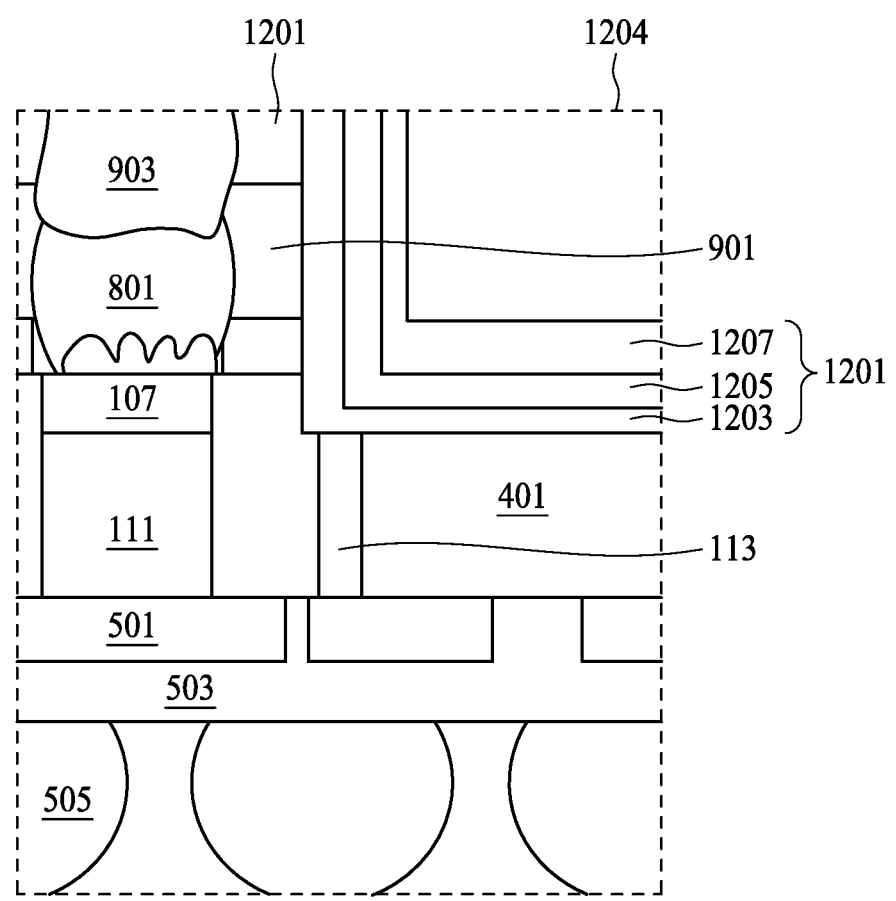

FIGS. 12A-12B illustrate that, once an upper surface of the reference vias 113 have been exposed, a shield coating 1201 may be formed over the first InFO-POP structure 1103 and the second InFO-POP structure 1105 and in physical and electrical connection with the exposed top surface of the reference vias 113 (with FIG. 12B illustrating an enlarged view of FIG. 12A's dashed box 1204). In an embodiment the shield coating 1201 may comprise multiple conformal layers of materials, wherein the thickness of each layer remains relative constant as each layer follows the contours of the underlying structure upon which it is formed, in order to shield the first InFO-POP structure 1103 and the second InFO-POP structure 1105, although if desired a single layer of material may be utilized.

In an embodiment the shield coating 1201 is a multi-layer structure, such as a bi-layer structure or a tri-layer structure with an adhesion layer 1203, a high-conductivity metal 1205, and an oxidation prevention material 1207. The adhesion layer 1203 is utilized to help the high-conductivity metal 1205 adhere to the underlying first InFO-POP structure 1103 and the second InFO-POP structure 1105. In an embodiment the adhesion layer 1203 may be a conductive metal such as titanium, although any suitable conductive material that can help adhere the high-conductivity metal may alternatively be used. The adhesion layer 1203 may be formed using, e.g., a deposition process such as physical vapor deposition (PVD), chemical vapor deposition (CVD), atomic layer deposition (ALD), spray coating, electroless plating, or the like, to a thickness of between about 0.05 μm and about 5 μm, such as about 0.1 μm.

After the adhesion layer 1203 has been formed, the high-conductivity metal 1205 may be formed to provide the desired shielding for the first InFO-POP structure 1103 and the second InFO-POP structure 1105. In an embodiment the high-conductivity metal 1205 may be a material such as copper, silver, a palladium/copper alloy, or the like, and may be formed to a thickness of between about 2 μm and about 10 μm, such as about 6 μm. The high-conductivity metal 1205 may be formed using a process such as PVD, CVD, ALD, plating, or spraying.

Optionally, if desired, once the high-conductivity metal 1205 has been formed, the high-conductivity metal 1205 may be protected from oxidation by applying the oxidation prevention material 1207. In an embodiment the oxidation prevention material 1207 may be a protective material such as nickel, although any other suitable material, such as nickel or SUS, may be used. The oxidation prevention material 1207 may be deposited by a process such as PVD, CVD, ALD, plating, or the like, to a thickness of between about 0.1 μm and about 15 μm, such as about 0.3 μm.

During the formation of the shield coating 1201, the shield coating 1201 will be formed in physical and electrical connection with the exposed top surfaces of one or more of the reference vias 113 and in physical contact with the encapsulant 401 and the underfill material 1021. By forming the shield coating 1201 in electrical connection with the reference vias 113, the shield coating 1201 can be electrically connected to the reference voltage (e.g., the ground voltage) through the third external connectors 505. As such, the reference voltage (e.g., ground) can be applied to the shield coating 1201 and assist in shielding the first InFO-POP structure 1103 and the second InFO-POP structure 1105.

Figure 13:
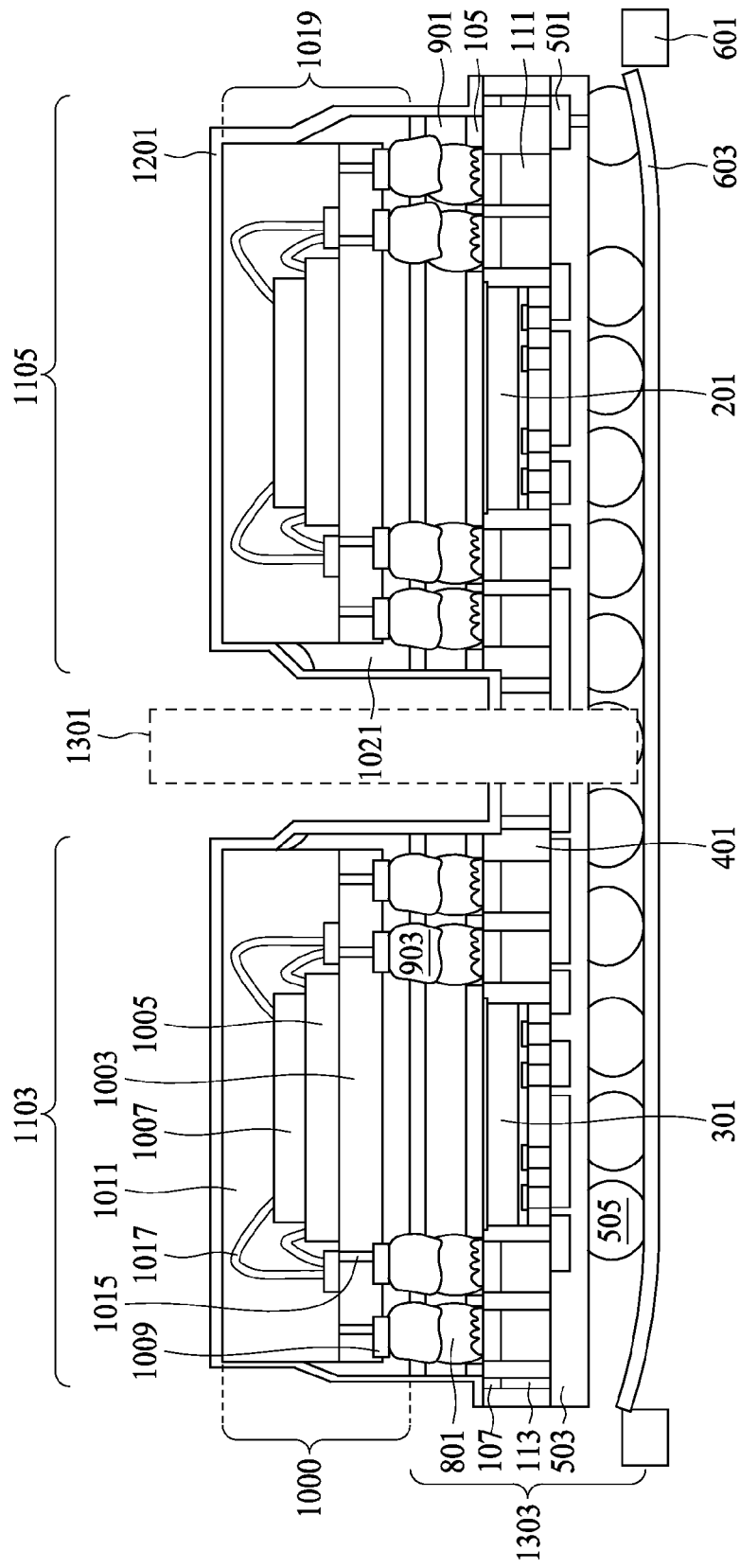
FIG. 13 illustrates a singulation of the shield coating in accordance with some embodiments.

FIG. 13 illustrates a second singulation process (represented in FIG. 13 by the dashed box labeled 1301) that may be used to separate the first InFO-POP structure 1103 and the second InFO-POP structure 1105 (wherein the first package 1000 is attached to an integrated fan-out package (InFO package) 1303). Additionally, for clarity the shield coating 1201 in FIG. 13 is illustrated as a single layer and not as the tri-layer structure illustrated in FIGS. 12A-12B. In an embodiment the second singulation process 1301 may be performed by using a saw blade (not shown) to slice through the shield coating 1201 and the encapsulant 401 between the reference vias 113, thereby separating one section from another to form the first InFO-POP structure 1103 and the second InFO-POP structure 1105. However, as one of ordinary skill in the art will recognize, utilizing a saw blade to singulate the first InFO-POP structure 1103 and the second InFO-POP structure 1105 is merely one illustrative embodiment and is not intended to be limiting. Alternative methods for singulating the first InFO-POP structure 1103 and the second InFO-POP structure 1105, such as utilizing one or more etches to separate the first InFO-POP structure 1103 and the second InFO-POP structure 1105, may be utilized, either separately or in combination. These methods and any other suitable methods may alternatively be utilized to singulate the first InFO-POP structure 1103 and the second InFO-POP structure 1105.

By utilizing the reference vias 113 in order to connect the shield coating 1201 to a reference potential, a conformal shielding structure for an InFO-PoP may be achieved without also enlarging the InFO die size by adding an additional ground pad formation at the formation of the vias 111 and without yet another ball at the InFO die edge (e.g., a DRAM ball at the InFO die edge). Additionally, without the inclusion of a ground pad, there is also no extra process for grinding the ground pad during formation, so additional costs savings may be achieved. Finally, there is no need to have a grounding at the front side redistribution layer or the back side redistribution layer just for the conformal shield coating 1201, which reduces any concerns about aspect ratios for the shield coating 1201.

Figure 14A:
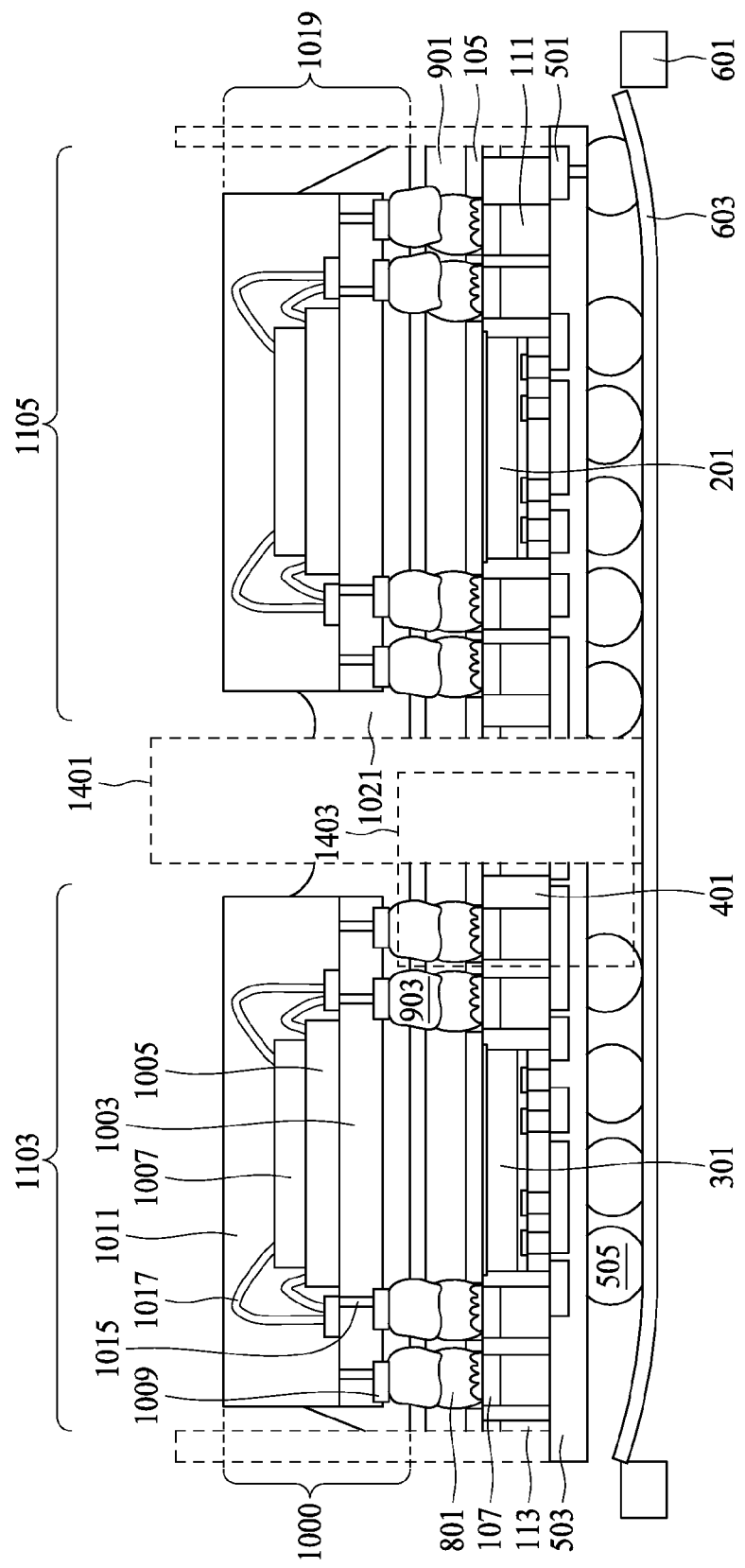
FIGS. 14A-14B illustrate an exposure of a sidewall of the reference via in accordance with some embodiments.
Figure 14B:
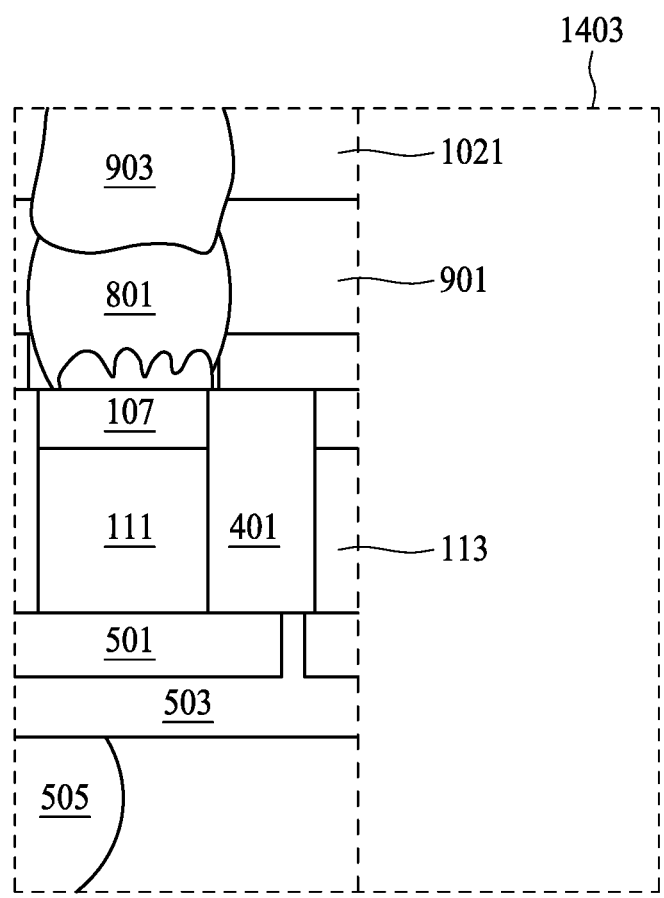

FIGS. 14A-14B illustrate another embodiment in which, instead of using both the first singulation process 1101 and the second singulation process 1301 to expose the reference vias 113 and then separate the first InFO-POP structure 1103 and the second InFO-POP structure 1105, a single, combined third singulation process (represented in FIG. 14A by the dashed line 1401) is utilized to both separate the first InFO-POP structure 1103 and the second InFO-POP structure 1105 as well as expose a sidewall of the reference vias 113 (with FIG. 14B illustrating an enlarged view of the dashed box in FIG. 14A labeled 1403). In this embodiment the third singulation process 1401 may be similar to the first singulation process 1101, such as by being a saw cutting process.

However, instead of exposing a top surface of the reference vias 113 as described above with respect to FIGS. 11A-11B, the third singulation process 1401 exposes a sidewall of the reference vias 113, either by cutting through the encapsulant 401 adjacent to the reference vias 113 or else by actually cutting through the reference vias 113 themselves. Any suitable method of using the third singulation process 1401 to expose a sidewall of the reference vias 113 without exposing the top surface of the reference vias 113 (which remains covered by the polymer layer 105) may be used.

Figure 15A:
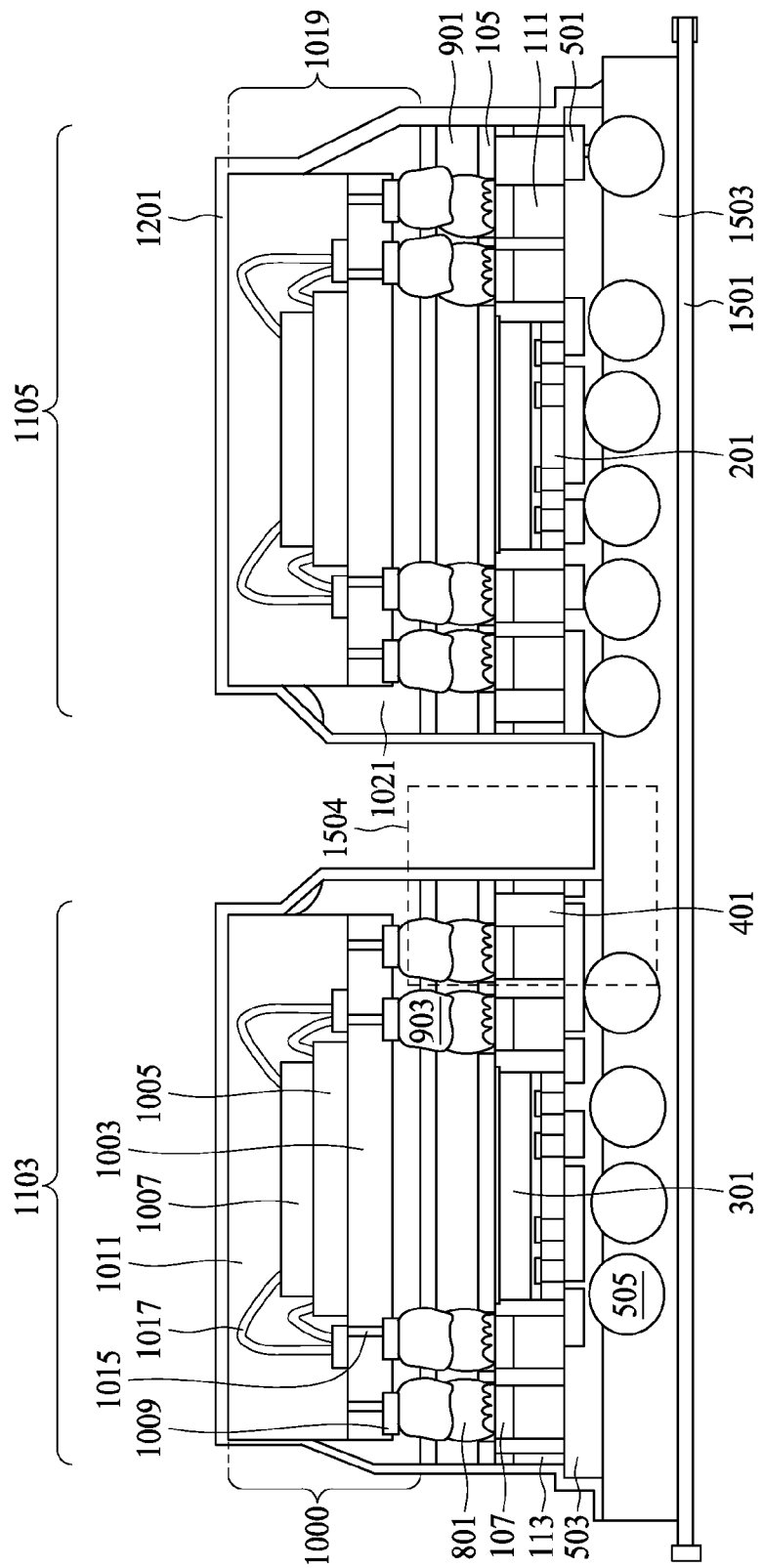
FIGS. 15A-15B illustrate a formation of the shield coating in connection with a sidewall of the reference via in accordance with an embodiment.
Figure 15B:
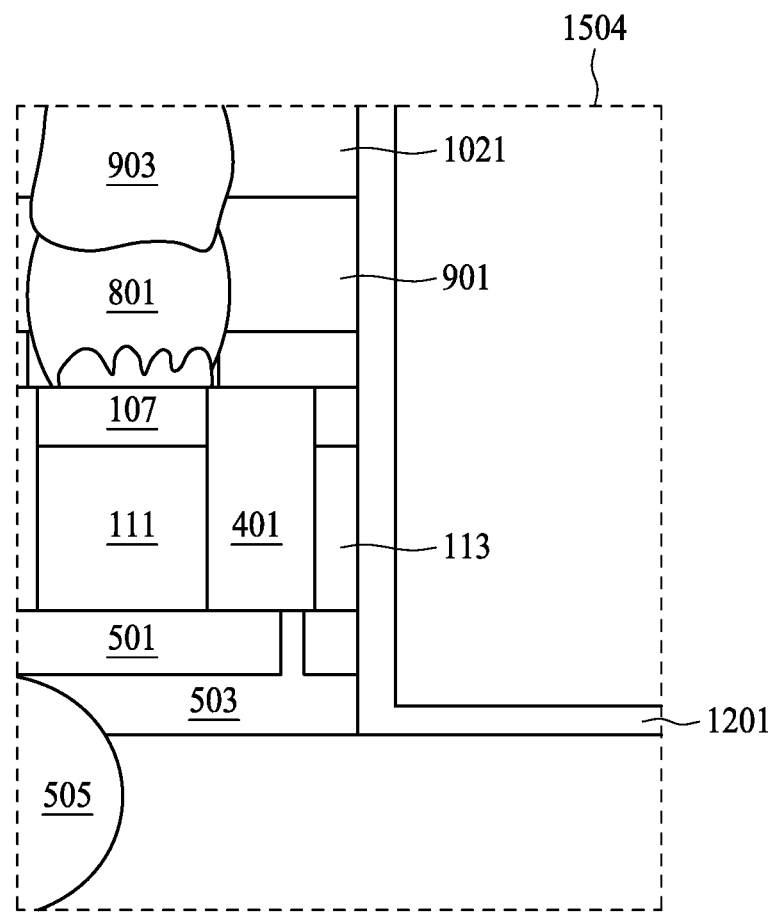

FIGS. 15A-15B illustrate a formation of the shield coating 1201 over the first InFO-POP structure 1103 and the second InFO-POP structure 1105 after the sidewall of the reference vias 113 have been exposed (with FIG. 15B illustrating an enlarged view of the dashed box in FIG. 15A labeled 1504). In this embodiment, because the first InFO-POP structure 1103 and the second InFO-POP structure 1105 have been fully separated already, the first InFO-POP structure 1103 and the second InFO-POP structure 1105 are moved to a first support structure 1501. Additionally, the third external connectors 505 are covered in order to prevent contact between the shield coating 1201 and the third external connectors 505.

In an embodiment the first InFO-POP structure 1103 and the second InFO-POP structure 1105 may be moved from the ring structure 601 to, for example, the first support structure 1501, which may be, e.g., a glue tape, although any alternative support structure may be utilized. In an embodiment, the first InFO-POP structure 1103 and the second InFO-POP structure 1105 may be moved using a pick and place process, although any suitable method of moving the first InFO-POP structure 1103 and the second InFO-POP structure 1105 may be used.

In an embodiment the first support structure 1501 may further comprise a glue layer 1503 that may be used to adhere cover the third external connectors 505. Additionally, the glue layer 1503 may also be used to cover the third external connectors 505 so that the deposition of the shield coating 1201 will not short circuit to the third external connectors 505. For example, the glue layer 1503 may be any suitable adhesive, such as an acrylic base adhesive, a silicon adhesive, or PSA, although any other suitable adhesive or covering material may be used.

FIGS. 15A-15B additionally illustrate the formation of the shield coating 1201 after the first InFO-POP structure 1103 and the second InFO-POP structure 1105 have been placed on the first support structure 1501 and the third external connectors 505 have been covered. In an embodiment the shield coating 1201 may be formed from similar materials and using similar processes as described above with respect to FIGS. 12A-12B. For example, the shield coating 1201 may be a tri-layer structure comprising the adhesion layer 1203, the high-conductivity metal 1205, and the oxidation prevention material 1207, or may be a bi-layer structure comprising the adhesion layer 1203 and the high-conductivity metal 1205, formed using a PVD or CVD process, although any suitable methods and materials may alternatively be utilized.

Looking more closely at FIG. 15B, because the reference vias 113 will have a sidewall exposed by the third singulation process 1401, when the shield coating 1201 is formed, the shield coating 1201 will be in physical and electrical connection with the exposed sidewall of the reference vias 113 and in physical connection with the encapsulant 401 (around the reference vias 113 and not specifically shown in the particular cross-section of FIG. 15B) and the underfill material 1021. As such, the reference voltage applied to the reference vias 113 (through, e.g., the third external connectors 505), will also be applied to the shield coating 1201 (through the sidewall) which now covers the first InFO-POP structure 1103 and the second InFO-POP structure 1105. As such, the reference voltage (e.g., ground) may be used to help shield the first InFO-POP structure 1103 and the second InFO-POP structure 1105.

Figure 16:
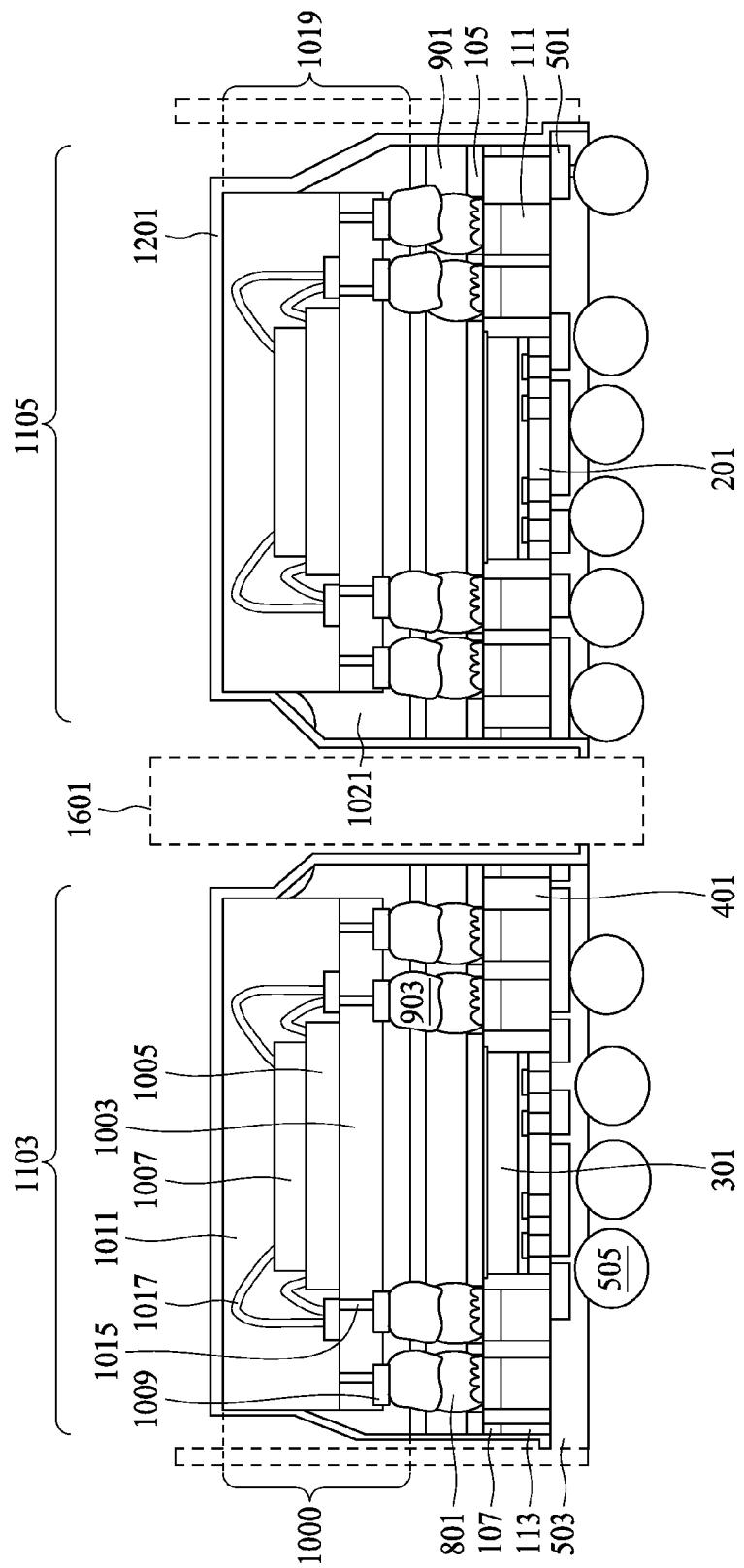
FIG. 16 illustrates a singulation of the shield coating in accordance with some embodiments.

FIG. 16 illustrates a fourth singulation process (represented in FIG. 16 by the dashed box labeled 1601) that may be used to separate the first InFO-POP structure 1103 and the second InFO-POP structure 1105 after the shield coating 1201 has been applied. In an embodiment the fourth singulation process 1601 may be similar to the second singulation process 1301 described above with respect to FIG. 13. For example, the fourth singulation process 1601 may be a saw used to cut through the shield coating 1201 and separate the first InFO-POP structure 1103 and the second InFO-POP structure 1105. However, any suitable singulation process may alternatively be utilized.

Figure 17A:
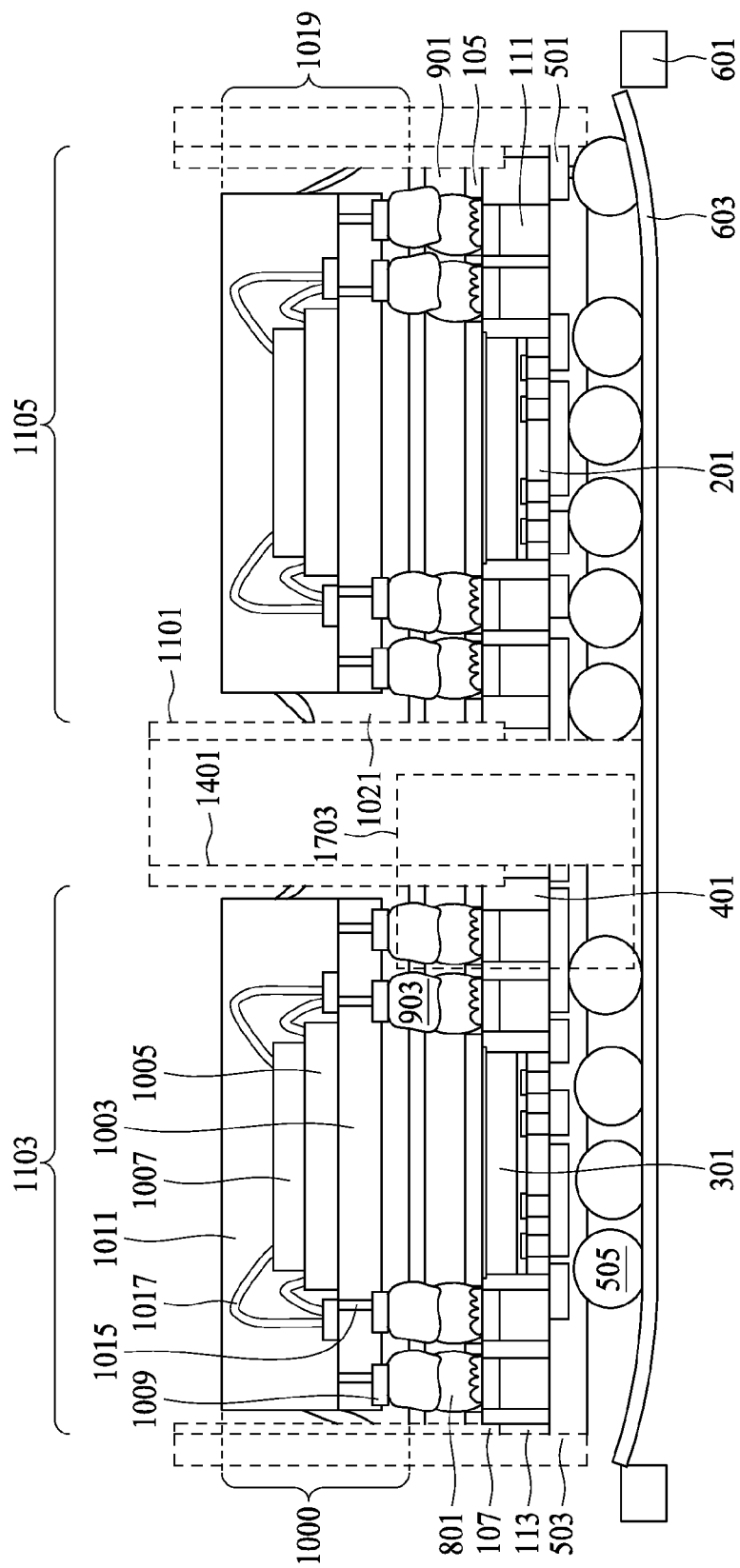
FIGS. 17A-17B illustrate an exposure of both a top surface and a sidewall of the reference via in accordance with some embodiments.
Figure 17B:
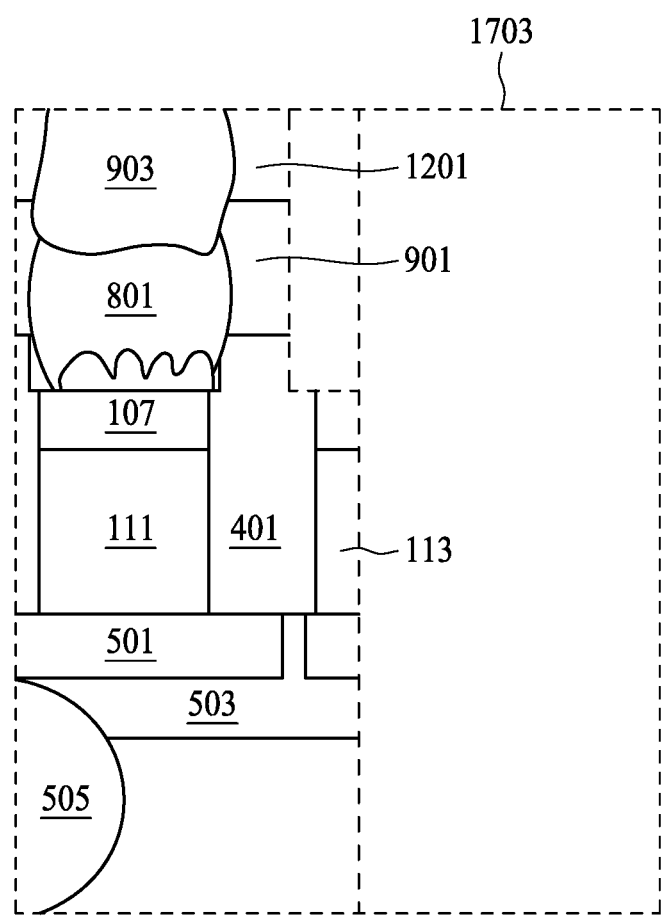

FIGS. 17A-17B illustrate yet another embodiment in which, rather than exposing only either the top surface or the sidewall of the reference vias 113, both the top surface and the sidewalls of the reference vias 113 are exposed (with FIG. 17B illustrating an enlarged view of the dashed box in FIG. 17A labeled 1703). In this embodiment the first singulation process 1101 (as described above with respect to FIGS. 11A-11B) may be utilized first to expose the top surface of the reference vias 113, as well as caused the reference vias 113 to have the first height $H_1$ less than the second height $H_2$ of the surrounding encapsulant 401. Once the top surfaces are exposed, the third singulation process 1401 (as described above with respect to FIGS. 14A-14B) may be utilized to both singulate the first InFO-POP structure 1103 and the second InFO-POP structure 1105 and also to expose at least one sidewall of the reference vias 113.

FIG. 17B illustrates the close up view of the reference vias 113 after the top surface and the sidewall has been exposed. As can be seen the polymer layer 105 has been removed from the top surface of the reference vias 113 by the first singulation process 1101, and the molding compound 113 has been removed from the sidewall of the reference vias 113 by the third singulation process 1401. As such, both the top surface and the sidewalls of the reference vias 113 are available for further processing.

However, while the process described above uses the first singulation process 1101 first and then uses the third singulation process 1401 second, this is intended to be illustrative and is not intended to limit the embodiments. Rather, any suitable process performed in any suitable order may alternatively be utilized. All such processes that may be used to expose both the top surface and the sidewalls of the reference vias 113 are fully intended to be included within the scope of the embodiments.

Figure 18A:
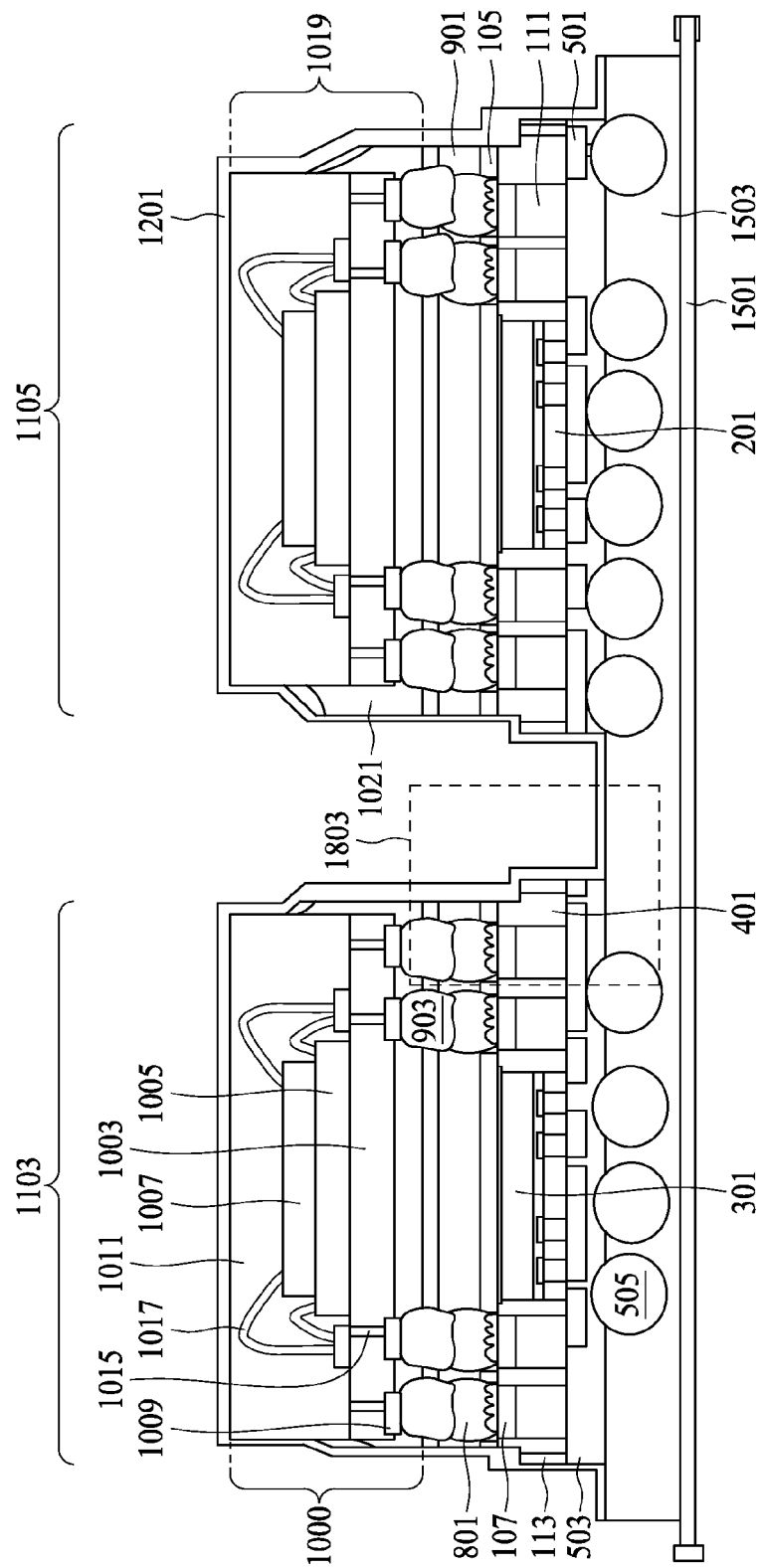
FIGS. 18A-18B illustrate a formation of the shield coating in connection with the top surface and the sidewall of the reference via in accordance with some embodiments.
Figure 18B:
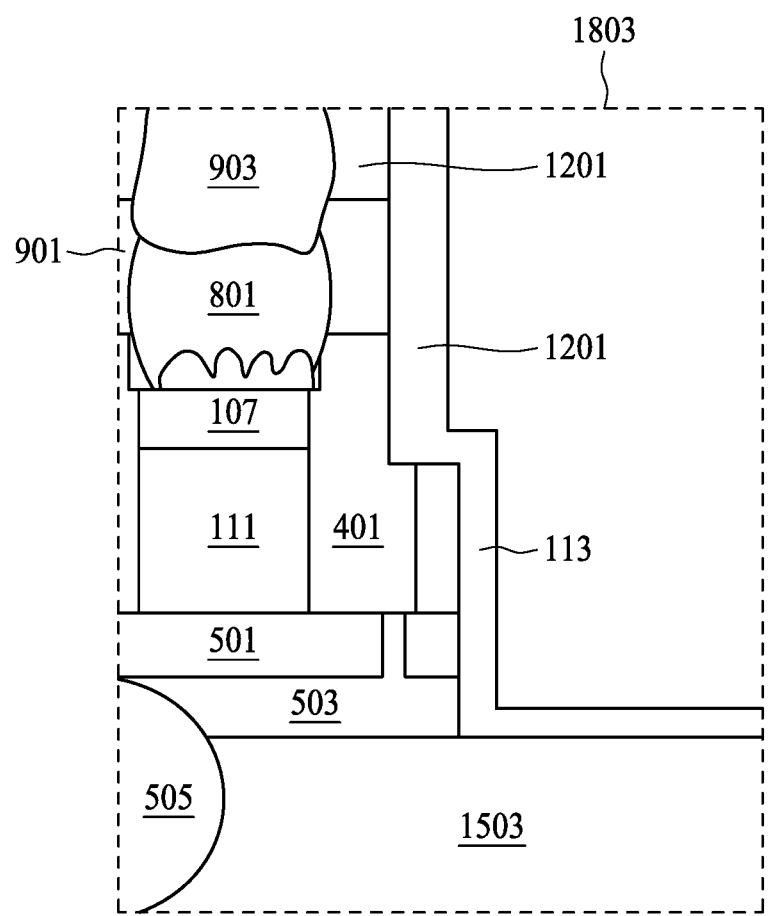

FIGS. 18A-18B illustrate a removal of the first InFO-POP structure 1103 and the second InFO-POP structure 1105 from the ring structure 601 and the placement of the first InFO-POP structure 1103 and the second InFO-POP structure 1105 onto the first support structure 1501 (with FIG. 18B illustrating an enlarged view of the dashed box in FIG. 18A labeled 1803). In an embodiment the first InFO-POP structure 1103 and the second InFO-POP structure 1105 may be moved as described above with respect to FIG. 15 (e.g., a pick and place process), although any suitable process for moving the first InFO-POP structure 1103 and the second InFO-POP structure 1105 may alternatively be used.

Once the first InFO-POP structure 1103 and the second InFO-POP structure 1105 have been moved (and the third external connectors 505 covered by, e.g., the glue layer 1503), the shield coating 1201 may be applied. In an embodiment the shield coating 1201 may be formed from similar materials and using similar processes as described above with respect to FIGS. 12A-12B. For example, the shield coating 1201 may be a tri-layer structure comprising the adhesion layer 1203, the high-conductivity metal 1205, and the oxidation prevention material 1207 or a bi-layer coating comprising the adhesion layer 1203 and the high-conductivity metal 1205 formed using a PVD or CVD process, although any suitable methods and materials may alternatively be utilized. The shield coating 1201 in this embodiment will be in physical contact with the encapsulant 401, the underfill material 1021, the top of the reference vias 113, and the sidewall of the reference vias 113.

Looking more closely at FIG. 18B, because the reference vias 113 will have both the top surface and the sidewall exposed, when the shield coating 1201 is formed the shield coating 1201 will be in physical and electrical connection with both the top surface as well as the exposed sidewall of the reference vias 113. As such, the reference voltage applied to the reference vias 113 (through, e.g., the third external connectors 505), will also be applied to the shield coating 1201 which now covers the first InFO-POP structure 1103 and the second InFO-POP structure 1105. As such, the reference voltage (e.g., ground) may be used to help shield the first InFO-POP structure 1103 and the second InFO-POP structure 1105.

Figure 19:
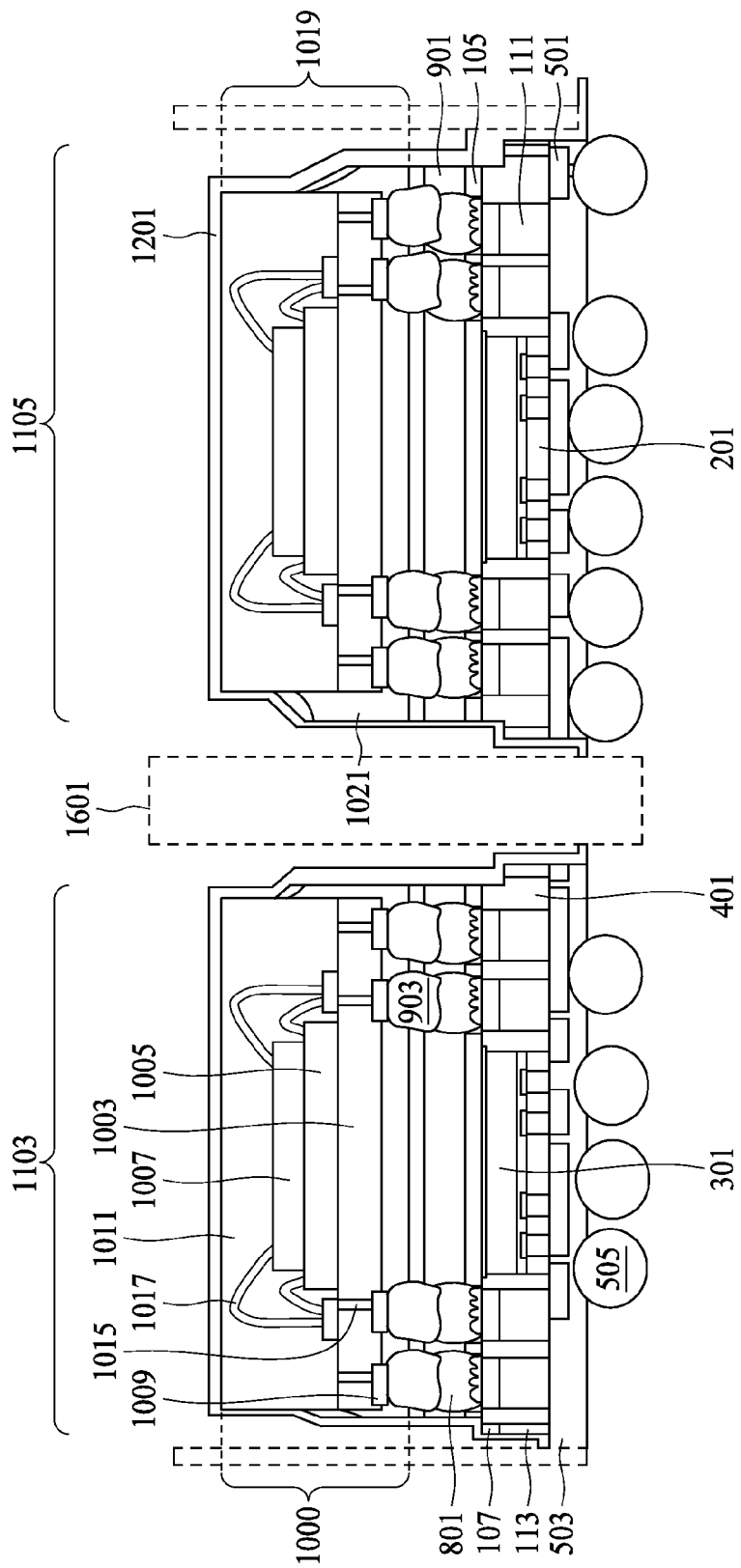
FIG. 19 illustrates a singulation of the shield coating in accordance with some embodiments.

FIG. 19 illustrates that a fourth singulation process 1601 may be used to separate the first InFO-POP structure 1103 and the second InFO-POP structure 1105 after the shield coating 1201 has been applied in this embodiment. In an embodiment the fourth singulation process 1601 may be similar to the second singulation process 1301 described above with respect to FIG. 13. For example, the fourth singulation process 1601 may be a saw used to cut through the shield coating 1201 and separate the first InFO-POP structure 1103 and the second InFO-POP structure 1105. However, any suitable singulation process may alternatively be utilized.

As previously mentioned, by utilizing the reference vias 113 in order to connect the shield coating 1201 to a reference potential, a conformal shielding structure for an InFO-PoP may be achieved without also enlarging the InFO die size by adding an additional ground pad formation at the formation of the vias 111 and without yet another ball at the InFO die edge (e.g., a DRAM ball at the InFO die edge). Additionally, without the inclusion of a ground pad, there is also no extra process for grinding the ground pad during formation, so additional costs savings may be achieved. Finally, there is no need to have a grounding at the front side redistribution layer or the back side redistribution layer just for the conformal shield coating 1201, which reduces any concerns about aspect ratios for the shield coating 1201.

Figure 20:
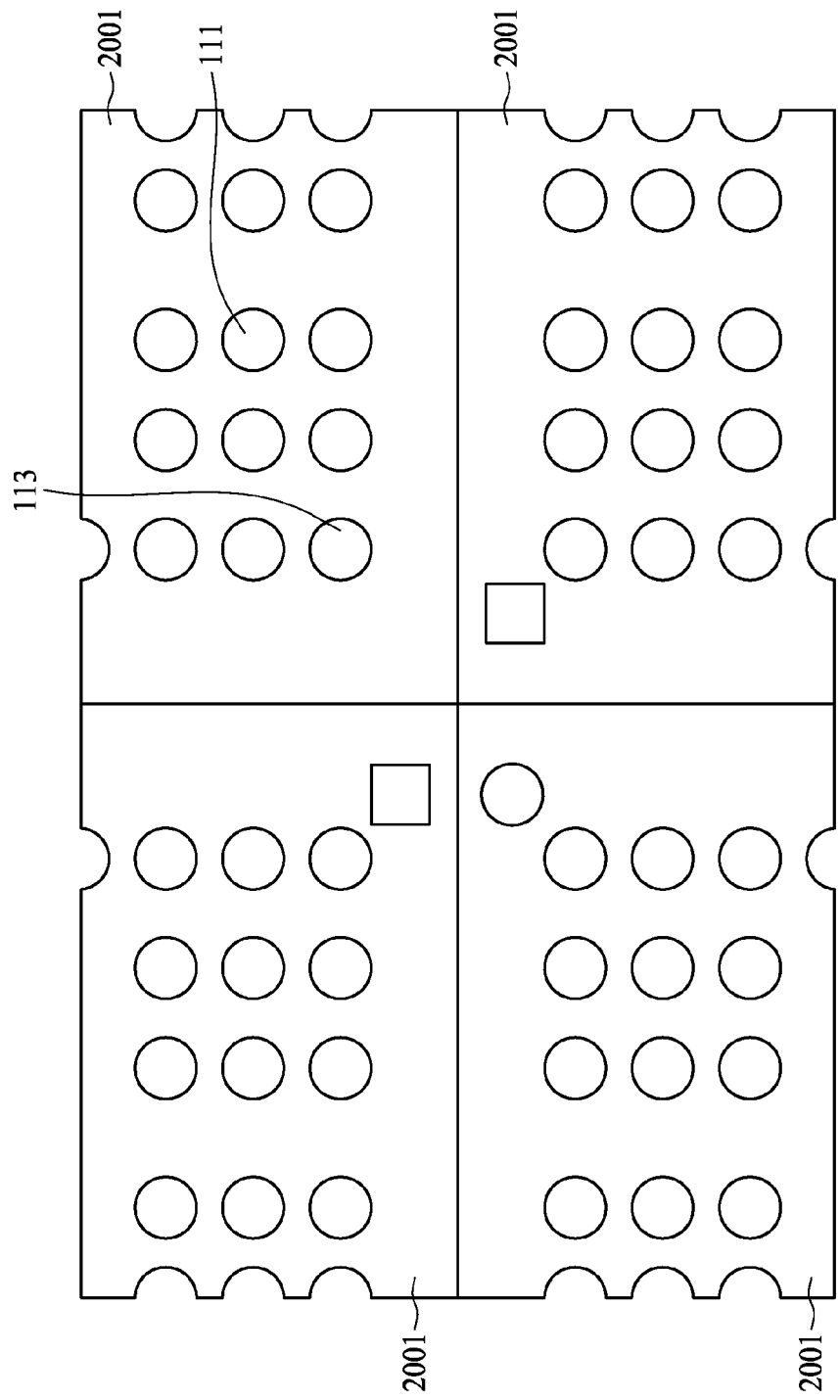
FIG. 20 illustrates different shapes that may be used for the reference via in accordance with some embodiments.

FIG. 20 illustrates a top down view of the reference vias 113 along with the vias 111 as they have been formed in a semiconductor wafer with a plurality of packages 2001, with four of the plurality of packages 2001 meeting in a middle section of FIG. 20. In this embodiment the reference vias 113 are formed in a cylindrical shape (as can be seen from the circular top down view). As can be seen, the reference vias 113 is formed in a corner of each of the separate ones of the plurality of packages 2001. However, the cylindrical shape of the reference vias 113 is not intended to be limiting and any other suitable shape may alternatively be utilized.

Figure 21A:
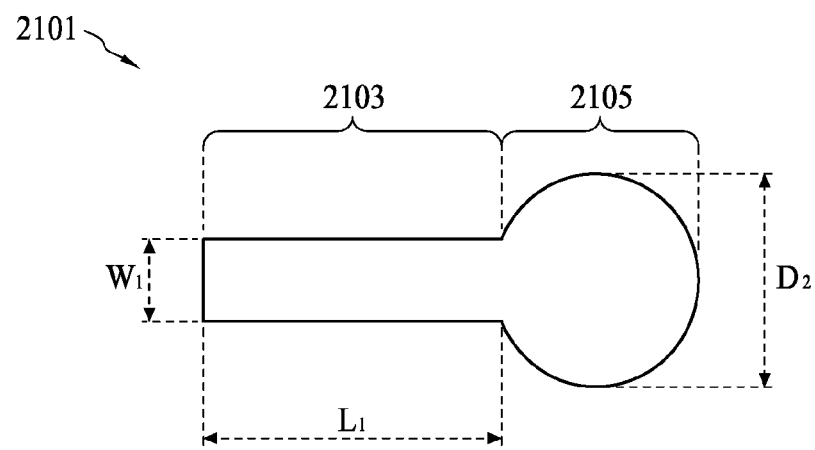
FIGS. 21A-21B illustrates a fin shaped reference via in accordance with some embodiments.
Figure 21B:
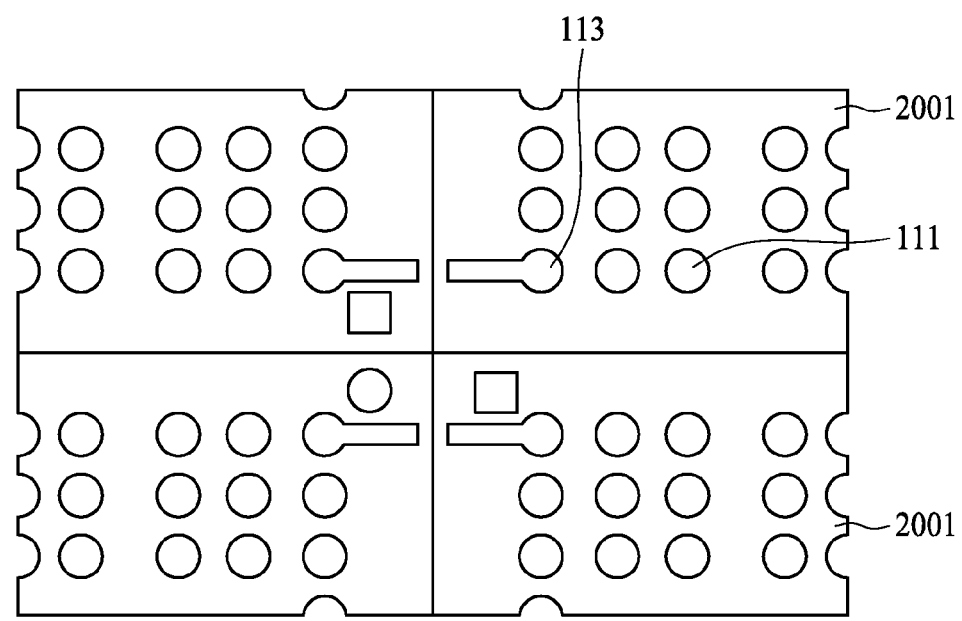

FIGS. 21A-21B illustrate another example of a shape that may be utilized for the reference vias 113. In this embodiment the reference vias 113 may be shaped as a first fin 2101 with a first extension 2103. In an embodiment the first fin 2101 may comprise a circular portion 2105 with, for example, a second diameter $D_2$ of between about 70 µm and about 400 µm, such as about 190 µm. The first fin 2101 may additionally have the first extension 2103 with a first width $W_1$ of between about 50 µm and about 200 µm, such as about 140 µm. In an embodiment the first extension 1203 may extend (prior to being exposed) to an edge of the semiconductor device, with a first length $L_1$ of between about 100 µm and about 350 µm, such as about 200 µm.

FIG. 21B illustrates a top down view of the first fin 2101 incorporated into adjacent ones of the semiconductor devices. As can be seen, multiple ones of the first fin 2101 may have first extensions 2103 that extend towards one another prior to the devices being singulated. When the first fins 2101 are exposed (using, e.g., the first singulation process 1101, the third singulation process 1401, or a combination thereof), either the circular portion 2105 or the first extension 2103, or both, may be exposed for connection with the subsequently deposited shield coating 1201.

Figure 22A:
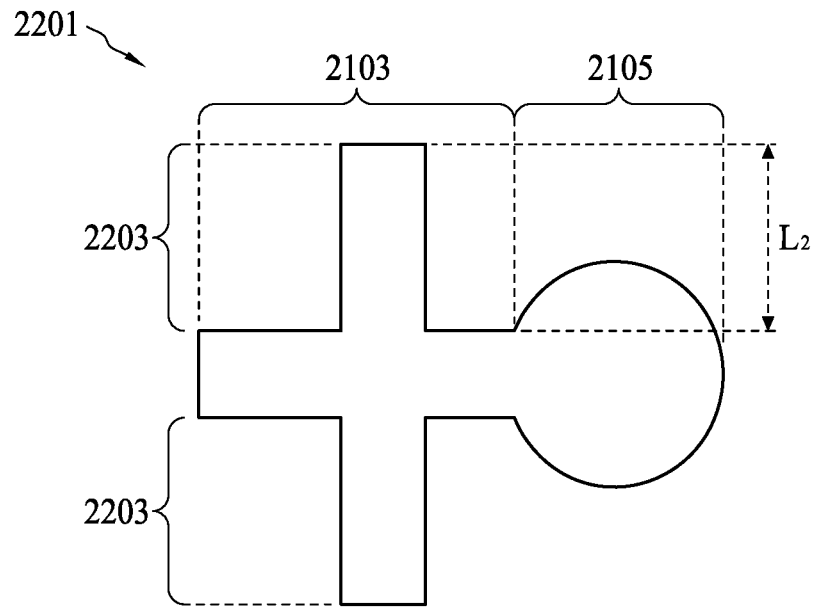
FIGS. 22A-22B illustrate other shapes for the reference via in accordance with some embodiments.
Figure 22B:
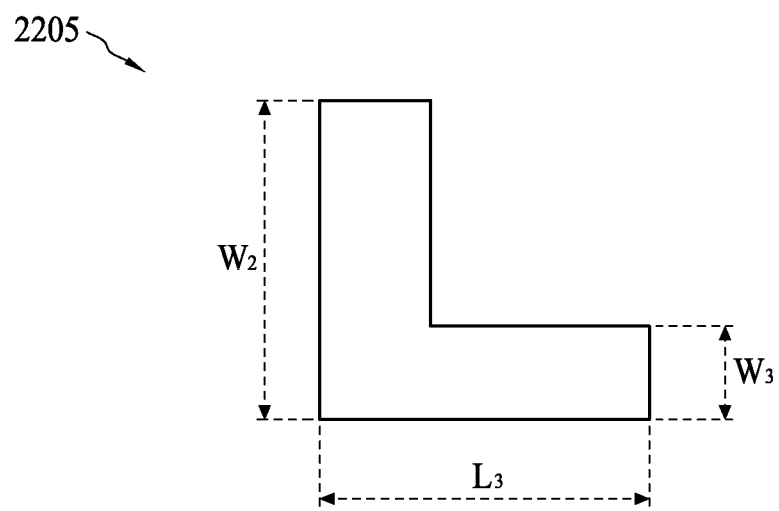

FIGS. 22A-22B illustrate other shapes that may be utilized to form the reference vias 113. FIG. 22A illustrates a second fin 2201 similar to the first fin 2101 in that the second fin 2201 has the circular portion 2105 and also has the first extension 2103. Additionally, however, the second fin 2201, as illustrated in FIG. 22A, has two additional extensions 2203 that extend at right angles from the first extension 2103. In an embodiment the two additional extensions 2203 may have the first width $W_1$ and may extend away from the first extension 2103 a second length $L_2$ of between about 30 µm and about 200 µm, such as about 100 µm.

FIG. 22B illustrates a right-angle shape 2205 that may be used instead of the first fin 2101 or the second fin 2201. In this embodiment the shape may have an overall second width $W_2$ of between about 100 µm and about 600 µm, such as about 250 µm, and an overall third length $L_3$ of between about 100 µm and about 600 µm, such as about 250 µm. Additionally, in this embodiment the right angle shape 2205 may be formed with a third width $W_3$ of between about 70 µm and about 400 µm, such as about 190 µm. However, any suitable shape may alternatively be utilized.

Additionally, while four shapes have been described in detail in the above descriptions, these descriptions are intended to be illustrative and are not intended to limit the embodiments. Rather, any suitable shapes, with any suitable dimensions, may alternatively be utilized. All such shapes and dimensions are fully intended to be included within the scope of the embodiments.

In accordance with an embodiment, a semiconductor device comprising a semiconductor die encased in an encapsulant is provided. First vias extend through the encapsulant and are separated from the semiconductor die by the encapsulant. At least one reference via extends through the encapsulant, wherein a scribe region surround the semiconductor die, the first vias, and the at least one reference via, wherein the semiconductor die is the only semiconductor die within the scribe region. A second semiconductor device electrically connected to the first vias but not electrically connected to the at least one reference via.

In accordance with another embodiment, a semiconductor device comprising a semiconductor die and a first set of through vias separated from the semiconductor die by an encapsulant is provided. A reference via is separated from the semiconductor die and the first set of through vias by the encapsulant, and a shield coating in physical contact with a first surface of the reference via.

In accordance with yet another embodiment, a method of manufacturing a semiconductor device comprising encapsulating a semiconductor die, a first set of through vias, and a reference via with an encapsulant is provided. The first set of through vias and the reference via are exposed with a planarization process on a first side of the semiconductor die. The first set of through vias on a second side of the semiconductor die opposite the first side are connected to a second semiconductor die, and, after the connecting the first set of through vias, a first surface of the reference via is exposed with a singulation process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a semiconductor die encased in an encapsulant;
first vias extending from a first side of the encapsulant to a second side of the encapsulant opposite the first side, the first vias being separated from the semiconductor die by the encapsulant, wherein the first vias are flush with the second side of the encapsulant material;
at least one reference via extending through the encapsulant, wherein the semiconductor die, the first vias, and the at least one reference via are part of a first integrated fan out package;
a second semiconductor device electrically connected to the first vias but not electrically connected to the at least one reference via; and
further comprising a shield coating over the second semiconductor device, wherein the shield coating is in physical contact with the at least one reference via.

2. The semiconductor device of claim 1, wherein the shield coating is in physical contact with a sidewall of the at least one reference via.

3. The semiconductor device of claim 1, wherein the shield coating is in physical contact with a top surface of the at least one reference via.

4. The semiconductor device of claim 1, wherein the shield coating is in physical contact with both a top surface and a sidewall of the at least one reference via.

5. The semiconductor device of claim 1, wherein the at least one reference via is a ground via.

6. The semiconductor device of claim 1, wherein the second semiconductor device is a DRAM package located over a DRAM region of the first integrated fan out package, the reference vias being located outside of the DRAM region in a direction parallel with a major surface of the first integrated fan out package.

7. The semiconductor device of claim 1, wherein the at least one reference via has a first height and at least one of the first vias has a second height larger than the first height.

8. A semiconductor device comprising:
a semiconductor die;
a first set of through vias separated from the semiconductor die by an encapsulant;
a reference via separated from the semiconductor die and the first set of through vias by the encapsulant; and
a shield coating in physical contact with a first surface of the reference via, wherein the shield coating continuously extends over the semiconductor die.

9. The semiconductor device of claim 8, wherein the encapsulant has a first thickness and the reference via has a second thickness less than the first thickness.

10. The semiconductor device of claim 8, wherein the shield coating extends over a second semiconductor die, the second semiconductor die in electrical connection with the first set of through vias but not in electrical connection with the reference via.

11. The semiconductor device of claim 8, wherein the reference via has a fin shape with a first extension.

12. The semiconductor device of claim 11, wherein the fin shape has a second extension at a right angle to the first extension.

13. The semiconductor device of claim 8, wherein the reference via has a wall shape with a right angle within the wall shape.

14. The semiconductor device of claim 8, wherein the shield coating is in physical contact with a second surface of the reference via different from the first surface of the reference via.

15. A semiconductor device comprising:
an encapsulant with a first portion and a second portion, wherein the second portion has a smaller thickness than the first portion;
a semiconductor die embedded within the first portion of the encapsulant;
a first via located within the first portion of the encapsulant and extending from a first side of the encapsulant to a second side of the encapsulant opposite the first side; and
a second via located within the second portion of the encapsulant and extending from the first side of the encapsulant to a third side of the encapsulant opposite the first side, wherein the first via has a first height and the second via has a second height less than the first height.

16. The semiconductor device of claim 15, wherein the second via is a reference via.

17. The semiconductor device of claim 16, further comprising a shield layer in electrical connection with the reference via.

18. The semiconductor device of claim 17, wherein the shield layer extends over a semiconductor die bonded to the first via.

19. The semiconductor device of claim 15, wherein the second via is in electrical connection with a redistribution layer, the redistribution layer being located adjacent to the first side of the encapsulant.

20. The semiconductor device of claim 15, wherein the second via has a fin shape with a first extension.

* * * * *